US012672579B2

(12) United States Patent (10) Patent No.: US 12,672,579 B2
Roh et al. (45) Date of Patent: Jun. 30, 2026

(54) METHOD OF FABRICATING SEMICONDUCTOR PACKAGE AND SEMICONDUCTOR PACKAGE STRUCTURE INCLUDING THE SEMICONDUCTOR PACKAGE

(71) Applicant: Samsung Electronics Co., Ltd., Suwon-si (KR)

(72) Inventors: Junghyun Roh, Suwon-si (KR); Wangsun Lim, Suwon-si (KR); Manhee Han, Suwon-si (KR); Jaeyoung Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 18/390,205

(22) Filed: Dec. 20, 2023

(65) Prior Publication Data

US 2024/0266307 A1 Aug. 8, 2024

(30) Foreign Application Priority Data

Feb. 6, 2023 (KR) ........................ 10-2023-0015720

(51) Int. Cl.
*H10W 74/01* (2026.01)
*H10W 72/00* (2026.01)

(52) U.S. Cl.
CPC .......... *H10W 74/01* (2026.01); *H10W 72/019* (2026.01); *H10W 72/01951* (2026.01); *H10W 72/0198* (2026.01)

(58) Field of Classification Search
None
See application file for complete search history.

(56) References Cited

U.S. PATENT DOCUMENTS

| | | | |
|---|---|---|---|
| 7,713,845 B2 | 5/2010 | Morishige et al. | |
| 7,727,812 B2 | 6/2010 | Jung | |
| 7,790,578 B2 | 9/2010 | Furui | |
| 8,829,676 B2 | 9/2014 | Yu et al. | |
| 11,407,063 B2 | 8/2022 | Kinoshita | |
| 2006/0289966 A1 | 12/2006 | Dani et al. | |
| 2008/0076233 A1 | 3/2008 | Morishige et al. | |
| 2008/0128904 A1 | 6/2008 | Sakamoto | |
| 2021/0398926 A1* | 12/2021 | Xue ................... | H10W 70/481 |

(Continued)

FOREIGN PATENT DOCUMENTS

| | | |
|---|---|---|
| CN | 1941342 A | 4/2007 |
| JP | 2009-064832 A | 3/2009 |

*Primary Examiner* — Alexander G Ghyka
(74) *Attorney, Agent, or Firm* — Muir Patent Law, PLLC

(57) ABSTRACT

Provided is a method of fabricating a semiconductor package, the method including forming a passivation layer and a first protective layer covering a semiconductor substrate and conductive pad above a first surface of the semiconductor substrate, removing a portion of the passivation layer and a portion of the first protective layer to expose the conductive pad, forming a second protective layer covering the conductive pad on the first protective layer, grinding a second surface opposite the first surface of the semiconductor substrate, dicing the semiconductor substrate, and removing the second protective layer to expose the conductive pad, wherein the second protective layer does not expose the conductive pad during the grinding and during the dicing.

20 Claims, 17 Drawing Sheets

(56)　　　　　References Cited

U.S. PATENT DOCUMENTS

| | | | |
|---|---|---|---|
| 2022/0392839 A1* | 12/2022 | Chi ..................... | H10W 20/435 |
| 2023/0268299 A1* | 8/2023 | Yang ................... | H10W 74/014 |
| | | | 257/734 |
| 2024/0312836 A1* | 9/2024 | Chung ................... | H10P 54/00 |
| 2024/0363575 A1* | 10/2024 | Kim ................... | H10W 74/019 |

* cited by examiner

FIG. 1A

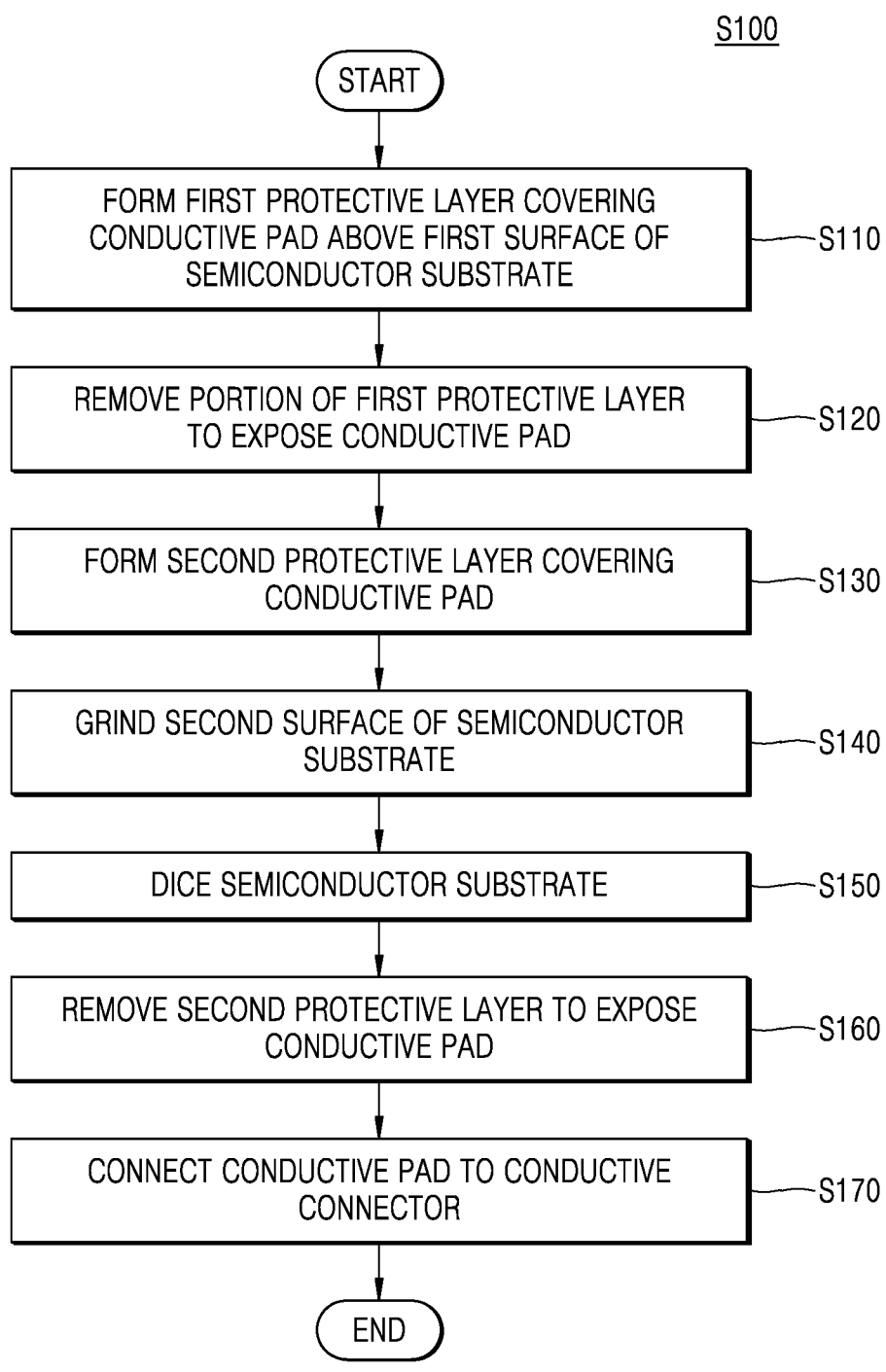

S100

START

FORM FIRST PROTECTIVE LAYER COVERING
CONDUCTIVE PAD ABOVE FIRST SURFACE OF
SEMICONDUCTOR SUBSTRATE — S110

REMOVE PORTION OF FIRST PROTECTIVE LAYER
TO EXPOSE CONDUCTIVE PAD — S120

FORM SECOND PROTECTIVE LAYER COVERING
CONDUCTIVE PAD — S130

GRIND SECOND SURFACE OF SEMICONDUCTOR
SUBSTRATE — S140

DICE SEMICONDUCTOR SUBSTRATE — S150

REMOVE SECOND PROTECTIVE LAYER TO EXPOSE
CONDUCTIVE PAD — S160

CONNECT CONDUCTIVE PAD TO CONDUCTIVE
CONNECTOR — S170

END

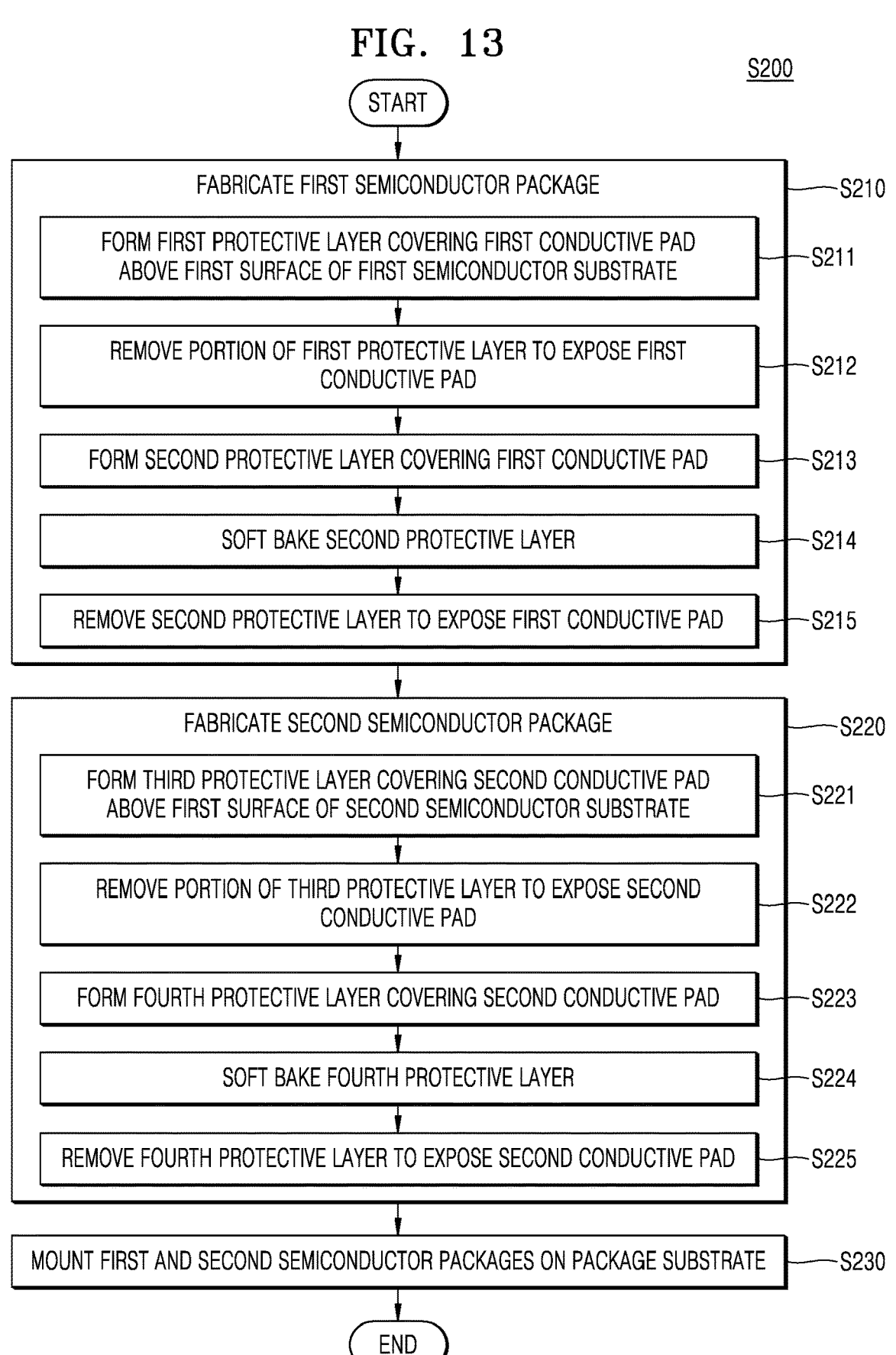

S200

START

FABRICATE FIRST SEMICONDUCTOR PACKAGE —— S210

FORM FIRST PROTECTIVE LAYER COVERING FIRST CONDUCTIVE PAD ABOVE FIRST SURFACE OF FIRST SEMICONDUCTOR SUBSTRATE —— S211

REMOVE PORTION OF FIRST PROTECTIVE LAYER TO EXPOSE FIRST CONDUCTIVE PAD —— S212

FORM SECOND PROTECTIVE LAYER COVERING FIRST CONDUCTIVE PAD —— S213

SOFT BAKE SECOND PROTECTIVE LAYER —— S214

REMOVE SECOND PROTECTIVE LAYER TO EXPOSE FIRST CONDUCTIVE PAD —— S215

FABRICATE SECOND SEMICONDUCTOR PACKAGE —— S220

FORM THIRD PROTECTIVE LAYER COVERING SECOND CONDUCTIVE PAD ABOVE FIRST SURFACE OF SECOND SEMICONDUCTOR SUBSTRATE —— S221

REMOVE PORTION OF THIRD PROTECTIVE LAYER TO EXPOSE SECOND CONDUCTIVE PAD —— S222

FORM FOURTH PROTECTIVE LAYER COVERING SECOND CONDUCTIVE PAD —— S223

SOFT BAKE FOURTH PROTECTIVE LAYER —— S224

REMOVE FOURTH PROTECTIVE LAYER TO EXPOSE SECOND CONDUCTIVE PAD —— S225

MOUNT FIRST AND SECOND SEMICONDUCTOR PACKAGES ON PACKAGE SUBSTRATE —— S230

END

FIG. 14B

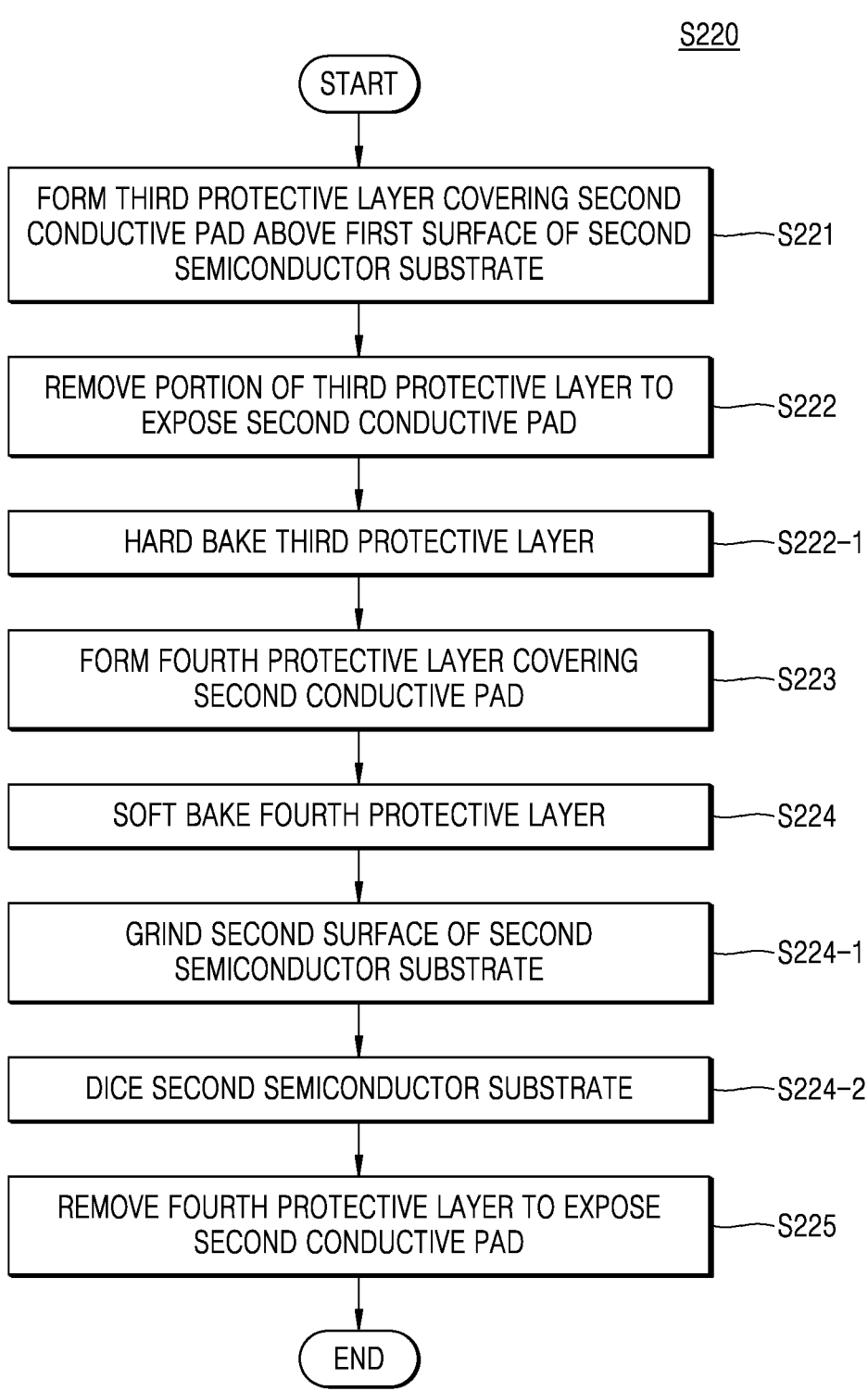

S220

START

FORM THIRD PROTECTIVE LAYER COVERING SECOND CONDUCTIVE PAD ABOVE FIRST SURFACE OF SECOND SEMICONDUCTOR SUBSTRATE —S221

REMOVE PORTION OF THIRD PROTECTIVE LAYER TO EXPOSE SECOND CONDUCTIVE PAD —S222

HARD BAKE THIRD PROTECTIVE LAYER —S222-1

FORM FOURTH PROTECTIVE LAYER COVERING SECOND CONDUCTIVE PAD —S223

SOFT BAKE FOURTH PROTECTIVE LAYER —S224

GRIND SECOND SURFACE OF SECOND SEMICONDUCTOR SUBSTRATE —S224-1

DICE SECOND SEMICONDUCTOR SUBSTRATE —S224-2

REMOVE FOURTH PROTECTIVE LAYER TO EXPOSE SECOND CONDUCTIVE PAD —S225

END

1

METHOD OF FABRICATING SEMICONDUCTOR PACKAGE AND SEMICONDUCTOR PACKAGE STRUCTURE INCLUDING THE SEMICONDUCTOR PACKAGE

CROSS-REFERENCE TO RELATED APPLICATION

This application is based on and claims priority under 35 U.S.C. § 119 to Korean Patent Application No. 10-2023-0015720, filed on Feb. 6, 2023, in the Korean Intellectual Property Office, the disclosure of which is incorporated by reference herein in its entirety.

BACKGROUND

Aspects of the inventive concept relate to a method of fabricating a semiconductor package and a semiconductor package structure including the semiconductor package.

In the past few decades, computing power and wireless communication technology have advanced rapidly due to discoveries in technology, materials and manufacturing processes. Accordingly, high direct implementation of high-performance transistors became possible, and the rate of integration doubled approximately every 18 months according to Moore's Law. The permanent goal of the semiconductor manufacturing industry is to provide light, thin and compact systems and power efficiency. Thus, 3D integrated packaging has been presented as an effective solution at this point in time when limits of economic and physical processes have reached.

SUMMARY

Aspects of the inventive concept provide a method of fabricating a semiconductor package with a reduced vertical thickness.

Aspects of the inventive concept provide a method of fabricating a semiconductor package with a reduced process.

Aspects of the inventive concept provide a method of fabricating a semiconductor package with improved performance and reliability.

Aspects of the inventive concept provide a method of fabricating a semiconductor package structure with a reduced vertical thickness.

Aspects of the inventive concept provide a method of fabricating a semiconductor package structure with a reduced process.

Aspects of the inventive concept provide a method of fabricating a semiconductor package structure with improved performance and reliability.

The inventive concept is not limited to those mentioned above, and other aspects of inventive concepts not mentioned above will be apparent to those skilled in the art from the description below.

According to an aspect of the inventive concept, there is provided a method of fabricating a semiconductor package, the method including forming a passivation layer and a first protective layer covering a semiconductor substrate and a conductive pad above a first surface of the semiconductor substrate; removing a portion of the passivation layer and a portion of the first protective layer to expose the conductive pad; forming a second protective layer covering the conductive pad on the first protective layer; grinding a second surface opposite the first surface of the semiconductor substrate; dicing the semiconductor substrate; and removing the second protective layer to expose the conductive pad, wherein the second protective layer does not expose the conductive pad in the grinding process and the dicing process.

According to another aspect of the inventive concept, there is provided a method of fabricating a semiconductor package structure, the method including forming a first semiconductor package including forming a first protective layer exposing a first conductive pad above a first surface of a first semiconductor substrate, forming a second protective layer covering the first conductive pad on the first protective layer, performing a soft-baking of the second protective layer, and removing the second protective layer to expose the first conductive pad; forming a second semiconductor package including forming a third protective layer exposing a second conductive pad above a first surface of a second semiconductor substrate, forming a fourth protective layer covering the second conductive pad on the third protective layer, and removing the fourth protective layer to expose the second conductive pad; and mounting the first semiconductor package on a package substrate and the second semiconductor package on the first semiconductor package.

According to an aspect of the inventive concept, there is provided a method of fabricating a semiconductor package, the method including forming a passivation layer and a first protective layer covering a semiconductor substrate and a conductive pad above a first surface of the semiconductor substrate, the first protective layer including a photosensitive material; removing a portion of the passivation layer and a portion of the first protective layer to expose the conductive pad; performing a hard-baking of the first protective layer; forming a second protective layer covering the conductive pad on the first protective layer; grinding a second surface opposite the first surface of the semiconductor substrate; dicing the semiconductor substrate; removing the second protective layer to expose the conductive pad; and connecting the exposed conductive pad to a conductive connector; wherein the second protective layer does not expose the conductive pad in the grinding operation and the dicing operation.

BRIEF DESCRIPTION OF THE DRAWINGS

Embodiments will be more clearly understood from the following detailed description taken in conjunction with the accompanying drawings in which:

FIG. 1A is a flowchart of a method of fabricating a semiconductor package step by step according to some embodiments;

FIG. 13 is a flowchart of a method of fabricating a semiconductor package structure step by step according to some embodiments;

FIGS. 14A and 14B are flowcharts of a method of fabricating a semiconductor package step by step according to some embodiments.

DETAILED DESCRIPTION OF THE EMBODIMENTS

Hereinafter, embodiments will be described in detail with reference to the accompanying drawings.

FIG. 1A is a flowchart of a method S100 of fabricating a semiconductor package 100 step by step according to some embodiments.

Figure 1B:
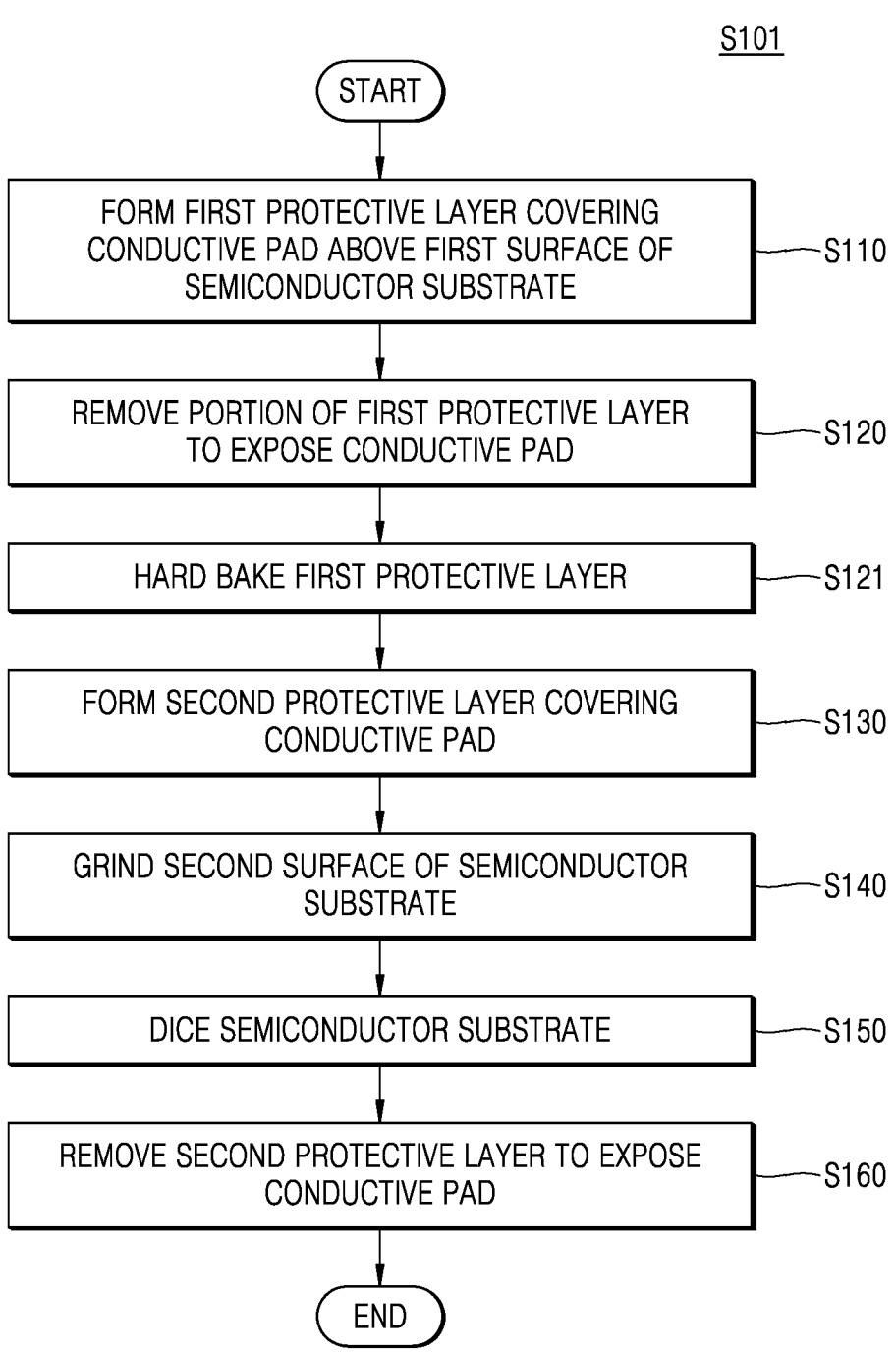
FIG. 1B is a flowchart of a method of fabricating a semiconductor package step by step according to some embodiments.

FIG. 1B is a flowchart of a method S101 of fabricating a semiconductor package step by step according to some embodiments.

FIGS. 2A, 2B, 3A, 3B, 4A, 4B, 5A, 5B, 6A, 6B, 7A, 7B, 8A, 8B, 9A, and 9B are cross-sectional views sequentially illustrating a method of fabricating a semiconductor package according to examples and comparative examples to describe a method of fabricating a semiconductor package according to some embodiments. Specifically, FIGS. 2A, 3A, 4A, 5A, 6A, 7A, 8A, and 9A are cross-sectional views sequentially illustrating a method of fabricating a semiconductor package 100 according to examples. Specifically, FIGS. 2B, 3B, 4B, 5B, 6B, 7B, 8B, and 9B are cross-sectional views sequentially illustrating a method of fabricating a semiconductor package 200 according to comparative examples.

Figure 2A:
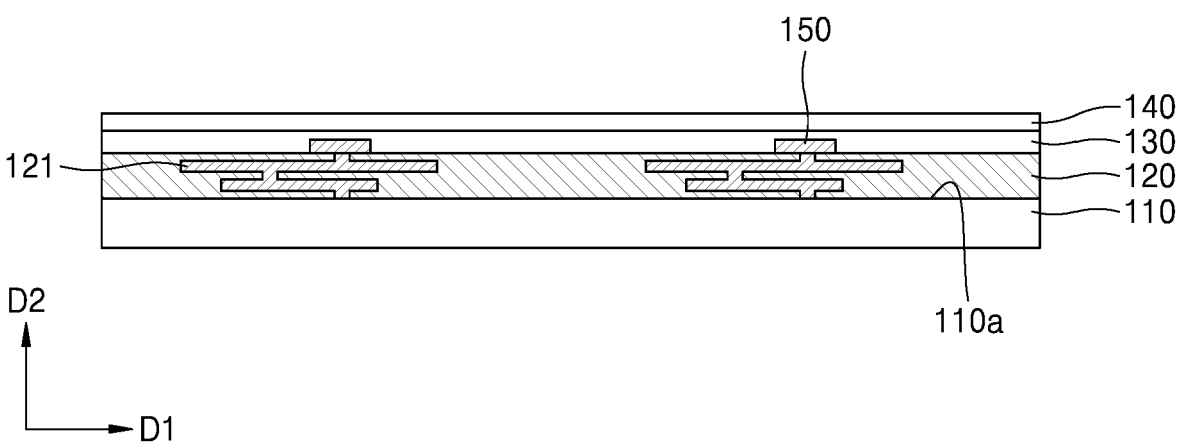
FIGS. 2A, 2B, 3A, 3B, 4A, 4B, 5A, 5B, 6A, 6B, 7A, 7B, 8A, 8B, 9A, and 9B are cross-sectional views sequentially illustrating a method of fabricating a semiconductor package according to examples and comparative examples to describe a method of fabricating a semiconductor package according to some embodiments.

Referring to FIGS. 1A and 2A, an operation S110 of forming a first protective layer 140 covering conductive pad 150 above a first surface 110*a* of a semiconductor substrate 110 may be performed, according to an embodiment.

For example, as shown in FIG. 2A, a semiconductor element layer 120 and redistribution pattern 121 positioned inside the semiconductor element layer 120 may be formed on the semiconductor substrate 110. The conductive pad 150 electrically connected to (e.g., contacting) the redistribution pattern 121 may be formed on the semiconductor element layer 120. The first protective layer 140 and a passivation layer 130 covering the conductive pad 150 may be formed on the conductive pad 150.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The semiconductor substrate 110 may be a silicon wafer including silicon (Si), e.g., crystalline silicon, polycrystalline silicon, or amorphous silicon. Alternatively, the semiconductor substrate 110 may include semiconductor elements such as germanium (Ge), or compound semiconductors such as silicon carbide (SiC), gallium arsenide (GaAs), indium arsenide (InAs), and indium phosphide (InP). The semiconductor substrate 110 may have a silicon on insulator (SOI) structure including, for example, a buried oxide layer. The semiconductor substrate 110 may include a conductive region, e.g., a well doped with impurities or a structure doped with impurities. The semiconductor substrate 110 may have various element isolation structures such as a shallow trench isolation (STI) structure.

The semiconductor element layer 120 may include the redistribution pattern 121 therein to electrically connect a plurality of semiconductor elements to other wires formed in the semiconductor substrate 110. The redistribution pattern 121 may include or be formed of metal wiring layers and via plugs. For example, the redistribution pattern 121 may have a multilayer structure in which two or more metal wiring layers or two or more via plugs are alternately stacked and electrically connected to each other. For example, semiconductor elements/devices (e.g., transistors, wirings, semiconductor patterns, conductive patterns, insulator patterns, etc.) may be formed in the semiconductor element layer 120.

The passivation layer 130 and the first protective layer 140 may be independently selected from organic compounds, such as photosensitive polyimide (PSPI), and inorganic compounds, such as silicon oxide, silicon nitride, and silicon oxynitride. In some embodiments, the passivation layer 130 may include or be formed of silicon nitride. In some embodiments, the first protective layer 140 may include or be formed of PSPI. The thickness of the first protective layer 140 may be about 5 μm or less. For example, the first protective layer 140 may have a thickness of about 3 μm or less.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some embodiments, forming the first protective layer 140 may include applying a material that is to constitute the first protective layer 140 and then performing a soft bake process thereon to partially remove a solvent inside the first protective layer 140. The soft bake process may be performed at a temperature of about 90° C. to about 100° C. Through the soft bake process, at least a portion of the solvent inside the first protective layer 140 may not be removed.

The conductive pad 150 may be provided above an active surface of the semiconductor substrate 110. For example, the conductive pad 150 may be provided above the first surface 110*a* of the semiconductor substrate 110. In some embodiments, the conductive pad 150 may include or be formed of any metal material having electrical conductivity, e.g., aluminum (Al), copper (Cu), nickel (Ni), cobalt (Co), gold (Au), silver (Ag), or alloys thereof.

Figure 2B:
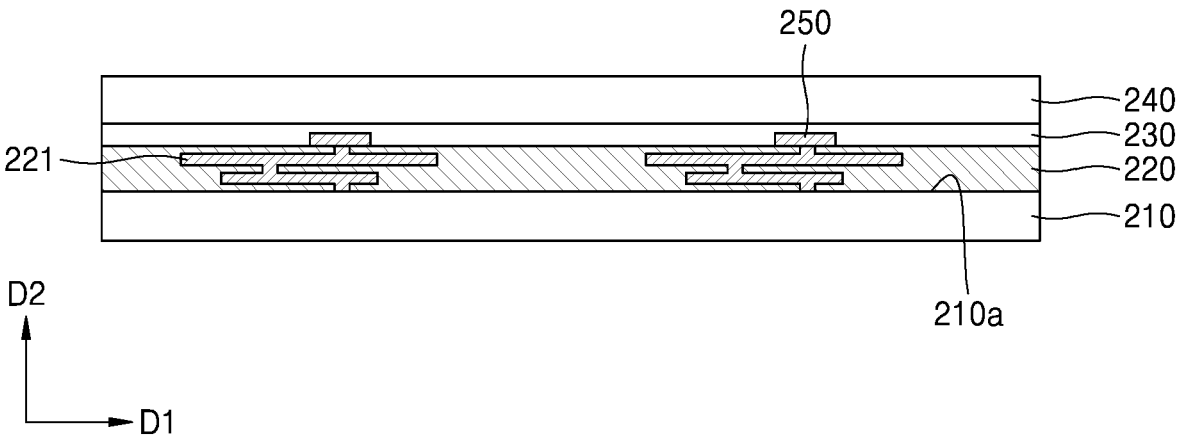

Referring to FIG. 2B, in a comparative example, a semiconductor element layer 220 may be formed on a semiconductor substrate 210, and redistribution pattern 221 may be formed in the semiconductor element layer 220. Conductive pad 250 electrically connected to the redistribution pattern 221 may be formed on the semiconductor element layer 220. A protective layer 240 and a passivation layer 230 covering the conductive pad 250 may be formed on the conductive pad 250. The protective layer 240 may have a thickness of about 6 μm or more. The thickness of the protective layer 240 may be greater than that of the first protective layer 140 in an example. The passivation layer 230 and the protective layer 240 may include or be formed of the same material as the passivation layer 130 and the first protective layer 140, respectively, described with reference to FIG. 2A above. For example, the passivation layer 230 may include or be formed of silicon nitride and the protection layer 240 may include or be formed of PSPI. Forming the protective layer 240 may be the same as or similar to forming the first protective layer 140 described with reference to FIG. 2A. For example, forming the protective layer 240 may include applying a material that is to constitute the protective layer 240 and performing a soft bake process thereon. Protective layers in the present disclosure may be protection layers formed of one or more insulating materials to protect conductor patterns, semiconductor patterns and/or insulation patterns during manufacturing processes and/or after semiconductor packages are manufactured.

Figure 3A:
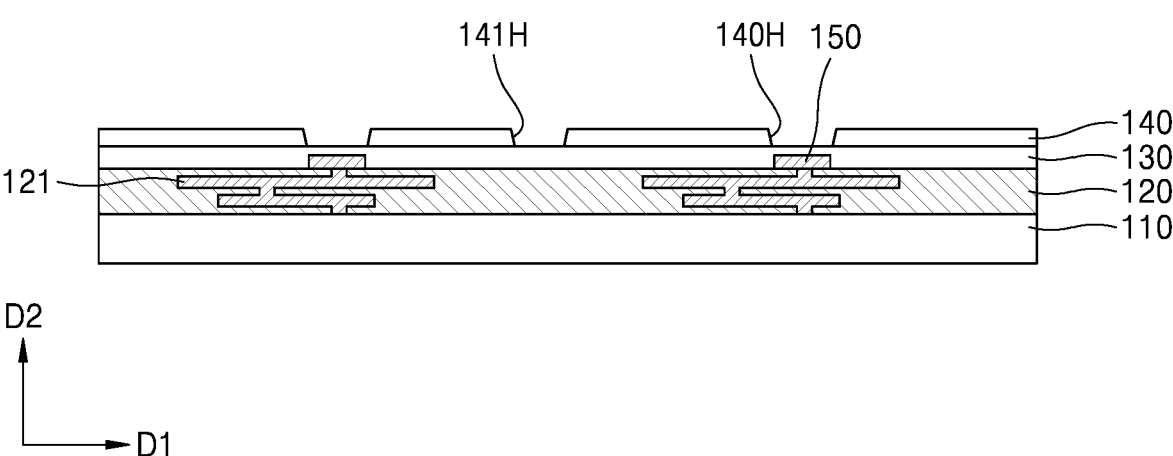
Figure 4A:
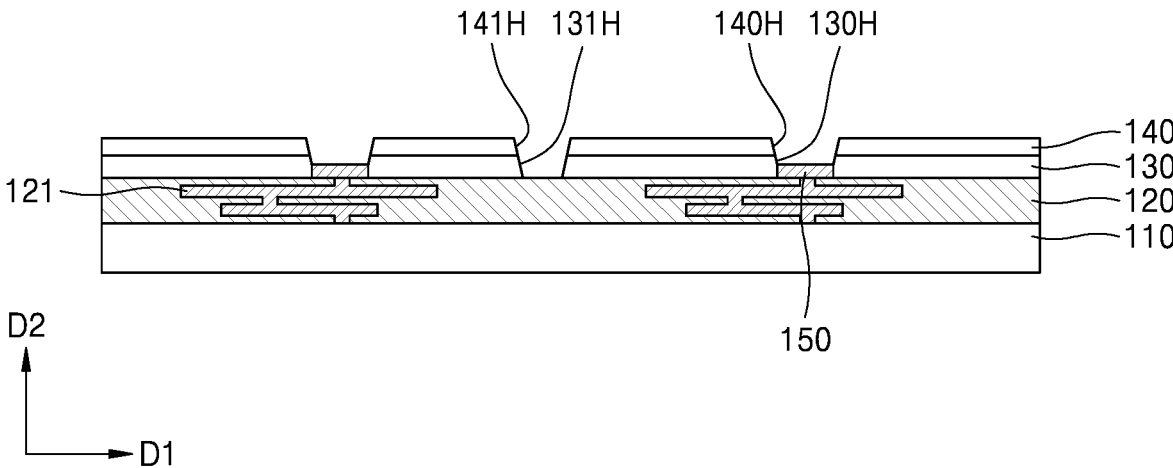

Referring to FIGS. 1A, 3A, and 4A, an operation S120 of removing a portion of the first protective layer 140 to expose the conductive pad 150 may be performed.

For example, as shown in FIG. 3A, a portion of the first protective layer 140 may be removed. In some embodiments, removing a portion of the first protective layer 140 may include exposing a portion of the first protective layer 140, e.g., to a light, and removing the exposed portion of the first protective layer 140 from an upper surface of the passivation layer 130. In some embodiments, removing a portion of the first protective layer 140 may include exposing a portion of the first protective layer 140 and removing an unexposed portion of the first protection layer 140 from the upper surface of the passivation layer 130.

In some embodiments, a first hole 140H may be formed by removing the portion of the first protective layer 140, and may expose a partial region of the passivation layer 130. The first hole 140H may overlap the conductive pad 150 in a second direction D2. For example, a first direction D1 may be a horizontal direction and the second direction D2 may be a vertical direction.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

In some embodiments, a second hole 141H may be formed by removing a portion of the first protective layer 140. The second hole 141H may be formed in a region including scribe line (not shown) in a dicing process to be described later. For example, the second hole 141H may be formed on a scribe line/lane. For example, the second hole 141H may vertically overlap the whole breadth of the scribe line/lane. The second hole 141H may expose a partial region of the passivation layer 130. The second hole 141H may be formed between the plurality of conductive pad 150, e.g., in the first direction. The second hole 141H may not overlap the plurality of conductive pad 150 in the second direction D2.

Subsequently, as shown in FIG. 4A, a portion of the passivation layer 130 may be removed to expose the conductive pad 150. In some embodiments, removing the portion of the passivation layer 130 may include etching the portion of the passivation layer 130 exposed through the first hole 140H of the first protective layer 140, using the first protective layer 140 as a mask (e.g., as an etch mask). For example, the portion of the passivation layer 130 may be removed by a dry etching. In this process, a portion of the first protective layer 140 may also be removed. While the portion of the passivation layer 130 is removed, at least a portion of the first protective layer 140 may not be removed. As a result of the above process, a first hole 130H of the passivation layer 130 may be formed, thereby exposing the conductive pad 150.

In some embodiments, removing the portion of the passivation layer 130 may include etching a portion of the passivation layer 130 exposed through the second hole 141H of the first protective layer 140, using the first protective layer 140 as a mask. As a result of the above process, a second hole 131H of the passivation layer 130 may be formed, thereby exposing a portion of the semiconductor element layer 120.

Figure 3B:
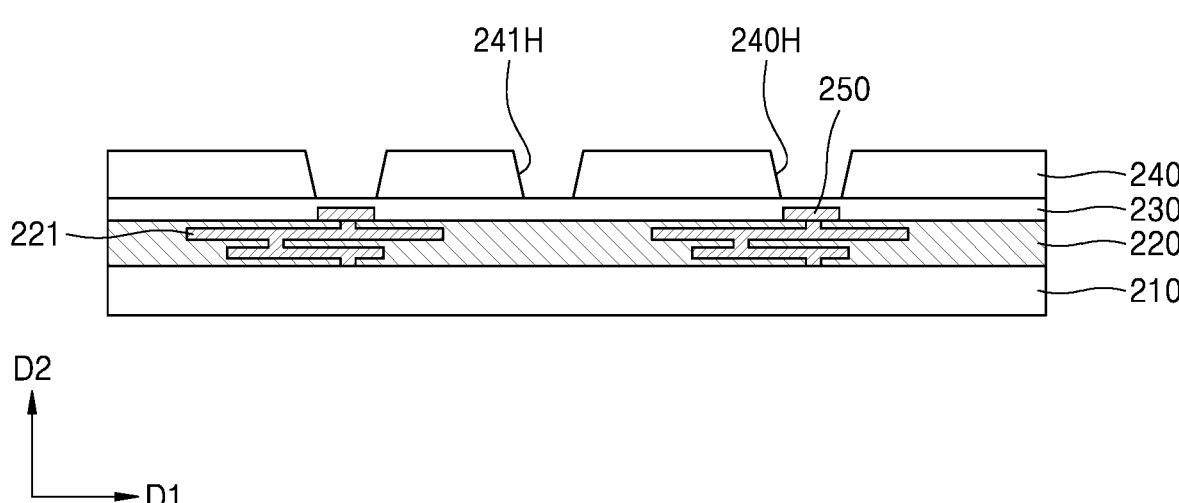
Figure 4B:
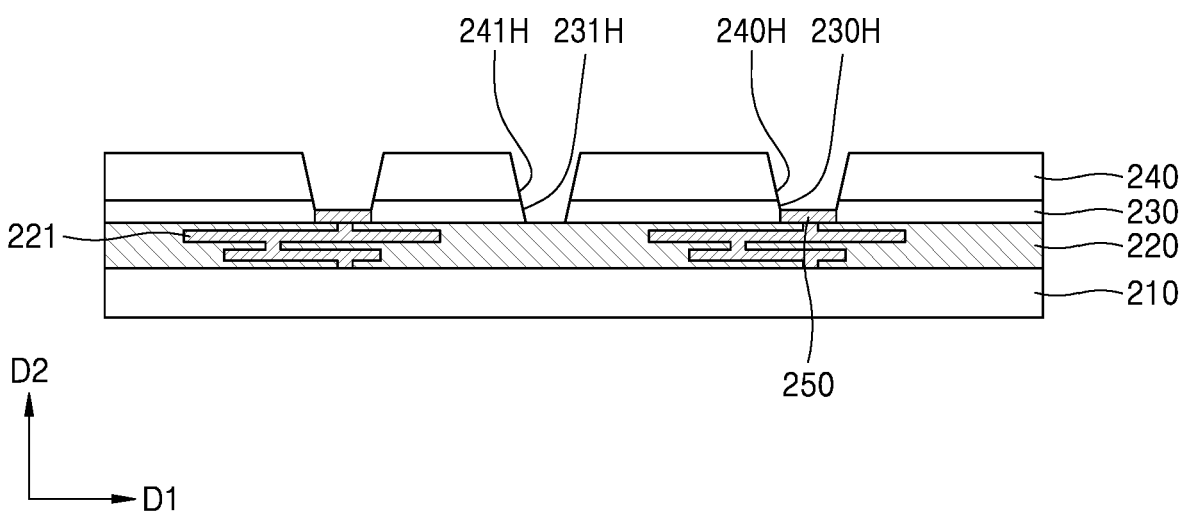

Referring to FIGS. 3B and 4B, in a comparative example, a portion of the protective layer 240 may be removed. Removing the portion of the protective layer 240 may be similar to removing the portion of the first protective layer 140 described with reference to FIG. 3A. For example, removing the portion of the protective layer 240 may include exposing the portion of the protective layer 240 and removing the exposed portion of the protective layer 240. Alternatively, removing the portion of the protective layer 240 may include exposing the portion of the protective layer 240 and removing an unexposed portion of the protective layer 240.

In some embodiments, a first hole 240H and a second hole 241H that expose portions of the passivation layer 230 may be formed by removing portions of the protective layer 240. The first hole 240H may overlap the conductive pad 250 in the second direction D2. The second hole 241H may be formed in a region including scribe line (not shown) in a dicing process to be described later.

Subsequently, as shown in FIG. 4B, in a comparative example, a portion of the passivation layer 230 may be removed to expose the conductive pad 250. In some embodiments, removing the portion of the passivation layer 230 may be similar to removing the portion of the passivation layer 130. For example, removing the portion of the passivation layer 230 may include etching the portion of the passivation layer 230 exposed through the first hole 240H and the second hole 241H of the protective layer 240, using the protective layer 240 as a mask. As a result of the above process, first and second holes 230H and 231H of the passivation layer 230 may be formed, thereby exposing the conductive pad 250 and a portion of the semiconductor element layer 220.

Figure 5A:
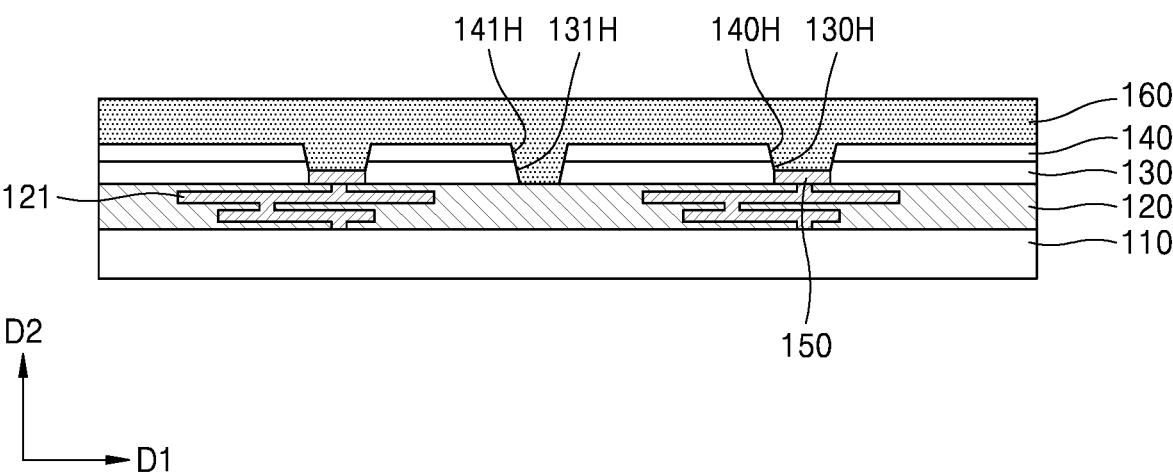

Referring to FIGS. 1A and 5A, an operation S130 of forming a second protective layer 160 covering the conductive pad 150 may be performed.

For example, as shown in FIG. 5A, the second protective layer 160 covering (e.g., contacting) the conductive pad 150, the passivation layer 130, and the first protective layer 140 may be formed, according to some embodiments. For example, the second protective layer 160 may fill the first hole 130H and the second hole 131H of the passivation layer 130 and the first hole 140H and the second hole 141H of the first protective layer 140.

In some embodiments, the second protective layer 160 may include or be formed of an insulating material. For example, the second protective layer 160 may include or be formed of a photosensitive material. For example, the second protective layer 160 may include or be formed of PSPI. However, the second protective layer 160 is not limited to those mentioned above and may include other appropriate materials. For example, the second protective layer 160 may be selected from easily removable materials.

In some embodiments, the second protective layer 160 may be formed through a spin coating process. In some embodiments, forming the second protective layer 160 may include applying a material that is to constitute the second protective layer 160 and then performing a soft bake process thereon to partially remove a solvent inside the second protective layer 160. The soft bake process may be performed at a temperature of about 90° C. to about 100° C. The thickness of the second protective layer 160 may be greater than that of the first protective layer 140. For example, the thickness of the second protective layer 160 may be greater than about 3 μm. For example, the thickness of the second protective layer 160 may be greater than about 5 μm.

Figure 5B:
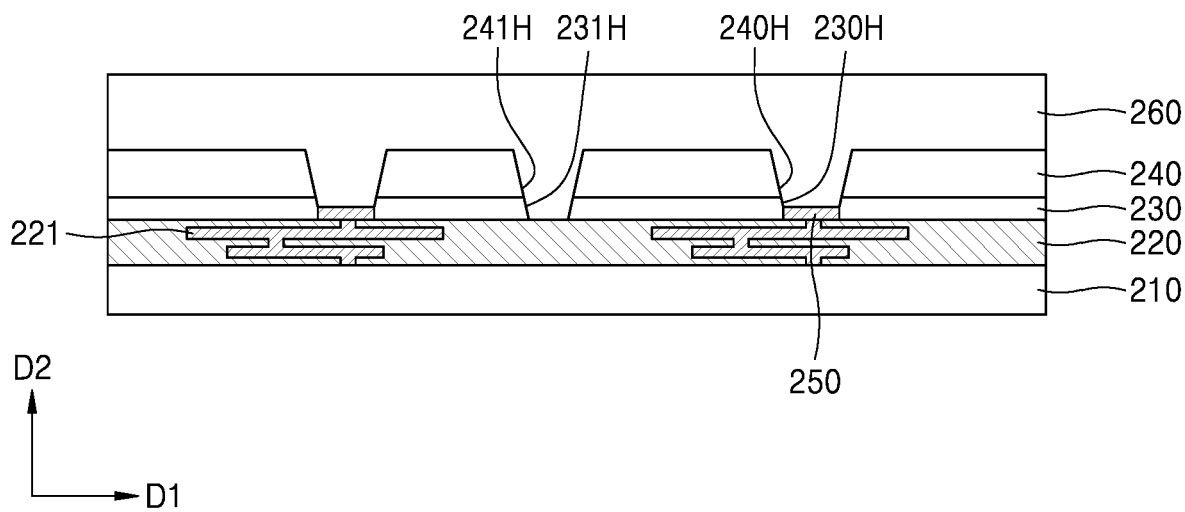

Referring to FIG. 5B, in a comparative example, a protective film 260 covering the conductive pad 250, the passivation layer 230, and the protective layer 240 may be formed. Specifically, the protective film 260 may fill the first hole 230H and the second hole 231H of the passivation layer 230 and the first hole 240H and the second hole 241H of the protective layer 240.

In some embodiments, the protective film 260 may include or be formed of a polymer-based film. Specifically, the protective film 260 may include or be formed of a lamination tape. In some embodiments, the protective film 260 may not be applied through a spin coating process. In some embodiments, the protective film 260 may not undergo a soft bake process.

Figure 6A:
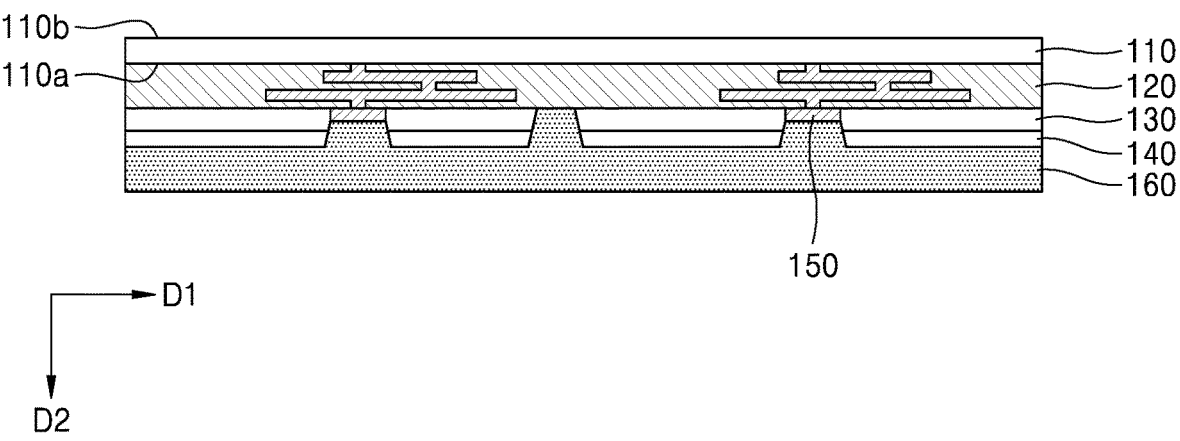

Referring to FIGS. 1A and 6A, an operation S140 of grinding a second surface 110b of the semiconductor substrate 110 may be performed. The second surface 110b of the semiconductor substrate 110 may be opposite to the first surface 110a thereof on which the conductive pad 150 is formed.

As shown in FIG. 6A, the second surface 110b of the semiconductor substrate 110 may face vertically upward by turning over the semiconductor substrate 110, the semiconductor element layer 120 on the semiconductor substrate 110, the passivation layer 130, the first protective layer 140, and the second protective layer 160, according to some embodiments. Subsequently, the second surface 110b of the semiconductor substrate 110 may be ground. Through the above process, the vertical thickness of the semiconductor substrate 110 may be reduced.

In some embodiments, the second protective layer 160 may protect the conductive pad 150 in the grinding process. For example, when the second protective layer 160 is not formed and the conductive pad 150 is exposed, the conductive pad 150 may be contaminated during the process of turning the semiconductor substrate 110 over and grinding the second surface 110b. The second protective layer 160 may cover the conductive pad 150 to prevent the contamination.

Figure 6B:
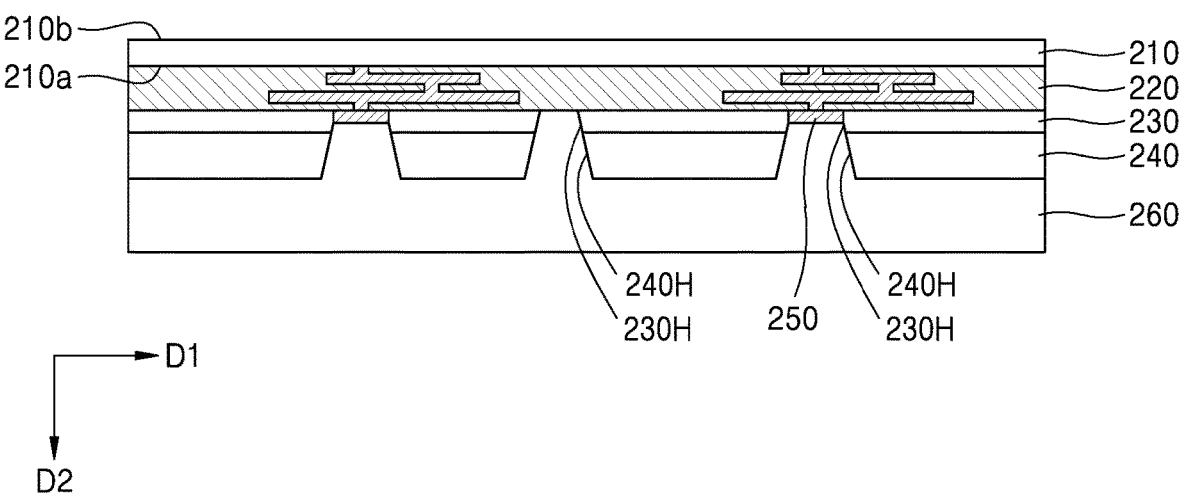

Referring to FIG. 6B, in a comparative example, a second surface 210b of the semiconductor substrate 210 may face vertically upward by turning over the semiconductor substrate 210, the semiconductor element layer 220 on the semiconductor substrate 210, the passivation layer 230, the protective layer 240, and the protective film 260. Subsequently, the vertical thickness of the semiconductor substrate 210 may be reduced by grinding the second surface 210b of the semiconductor substrate 210. The protective film 260 may prevent the conductive pad 250 from being contaminated during the above process. Subsequently, the protective film 260 may be removed. For example, the protective film 260 may not prevent the conductive pad 250 from being contaminated since the conductive pad 250 is exposed in a subsequent process.

Figure 7A:
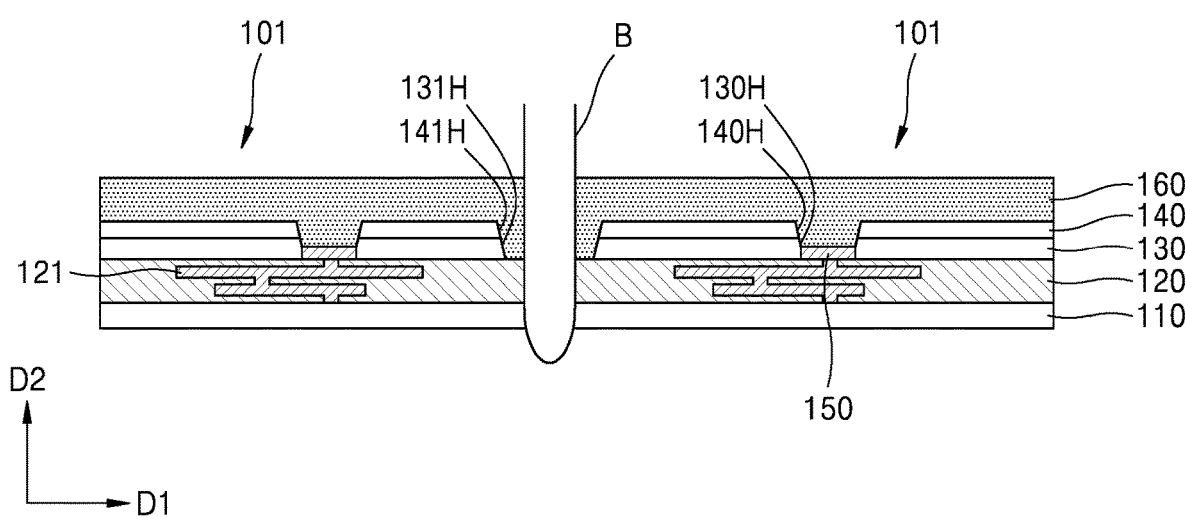

Referring to FIGS. 1A and 7A, an operation S150 of dicing the semiconductor substrate 110 may be performed.

As shown in FIG. 7A, a dicing process is performed by scribing/cutting between the plurality of conductive pad 150, e.g., along scribe line (not shown) in the second hole 131H of the passivation layer 130 and the second hole 141H of the first protective layer 140, according to some embodiments. For example, the dicing process may be performed using a blade B. For example, semiconductor chips 101 may be formed by dicing the second protective layer 160, the semiconductor element layer 120, and the semiconductor substrate 110, using the blade B.

In some embodiments, the second protective layer 160 may protect the conductive pad 150 in the dicing process. For example, when the second protective layer 160 is not formed and the conductive pad 150 is exposed, the conductive pad 150 may be contaminated by impurities and dust that may occur in the dicing process. The second protective layer 160 may cover the conductive pad 150 to prevent the contamination.

Figure 7B:
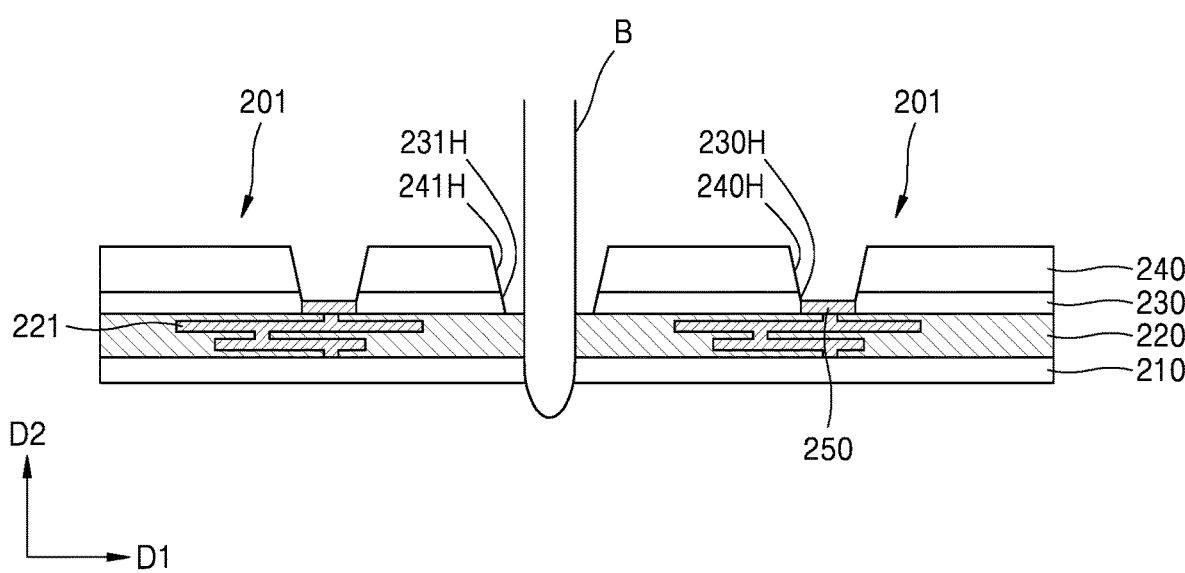

Referring to FIG. 7B, in a comparative example, the dicing process may be performed by scribing/cutting between the plurality of conductive pad 250, e.g., along scribe line (not shown) in the second hole 231H of the passivation layer 230 and the second hole 241H of the protective layer 240. For example, the dicing process is performed using the blade B. That is, semiconductor chips 201 may be formed by dicing the semiconductor element layer 220 and the semiconductor substrate 210, using the blade B.

In the present example, during the process of dicing the semiconductor substrate 210, the conductive pad 250 may not be protected because a layer corresponding to the second protective layer 160 (see FIG. 7A) is not formed. Specifically, the conductive pad 250 may be contaminated by impurities and dust that may occur in the dicing process. For example, it may be difficult to use the protective film 260 described with reference to FIG. 5B in the dicing process using the blade B due to material characteristics of the protective film 260. For example, when the dicing process is performed using the blade B without removing the protective film 260, it may not be easy to remove the protective film 260 in a subsequent process due to frictional heat that may occur in the dicing process and/or the blade B may be contaminated.

Figure 8A:
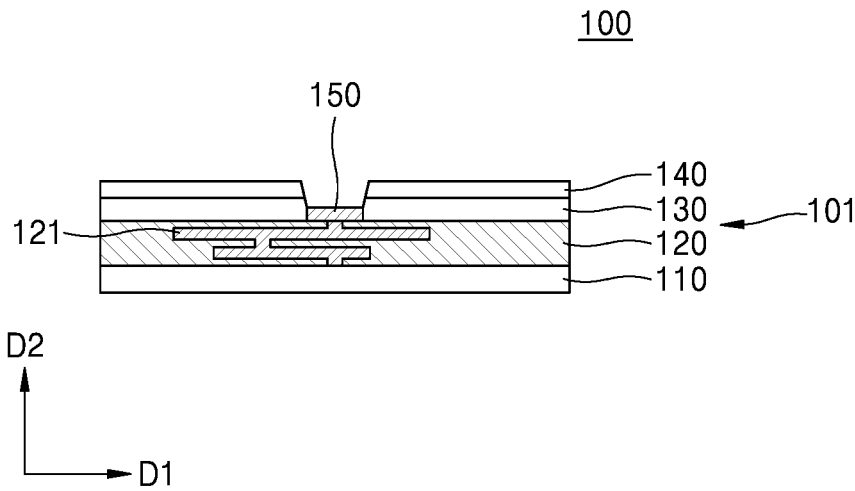

Referring to FIGS. 1A and 8A, an operation S160 of removing the second protective layer 160 to expose the conductive pad 150 again may be performed.

For example, as shown in FIG. 8A, the conductive pad 150 may be exposed again as the second protective layer 160 is removed, and a semiconductor package 100 including the semiconductor chips 101 may be formed, according to some embodiments. As mentioned above, the second protective layer 160 may be selected from easily removable materials. While the second protective layer 160 is removed, the first protective layer 140 may not be removed.

Figure 8B:
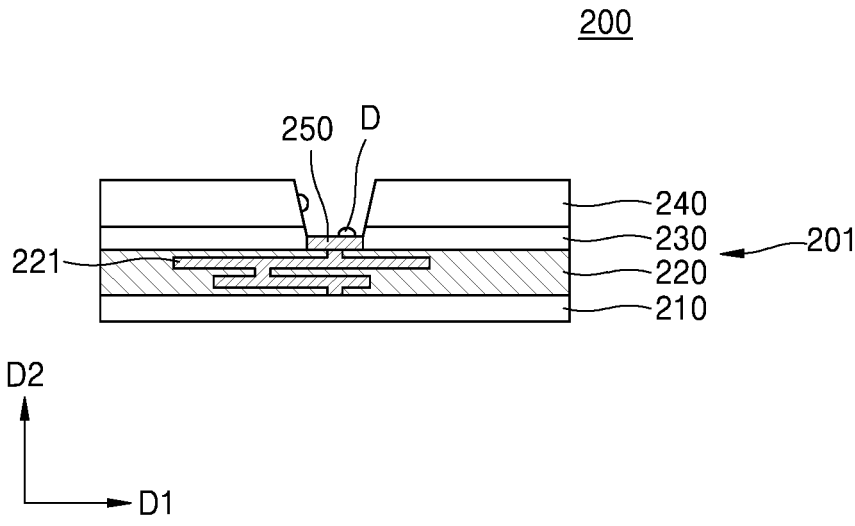

Referring to FIG. 8B, in a comparative example, a semiconductor package 200 including the semiconductor chips 201 may be formed. However, as described with reference to FIG. 7B, the conductive pad 250 may be contaminated due to impurities D that may occur in the dicing process using the blade B.

Figure 9A:
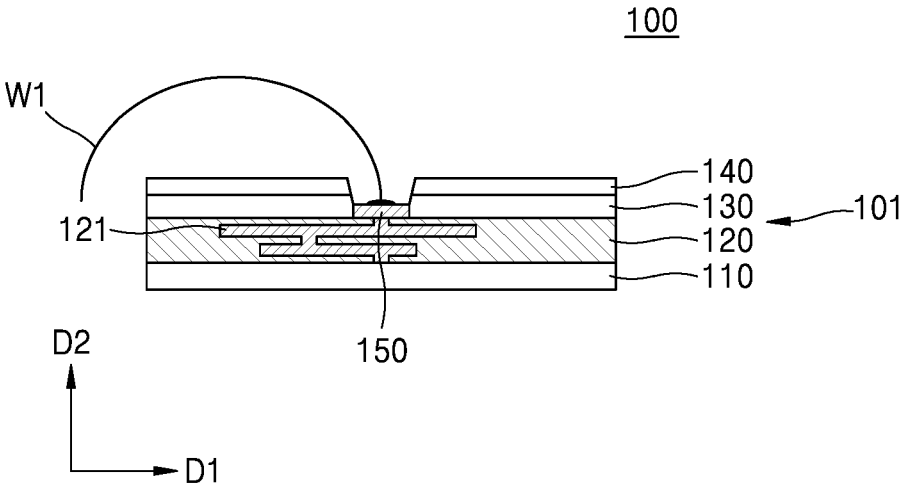

Referring to FIGS. 1A and 9A, an operation S170 of connecting the conductive pad 150 and a conductive connector may be performed.

For example, as shown in FIG. 9A, the conductive connector, e.g., a wire W1, may be formed on the conductive pad 150. As described above, the conductive pad 150 is prevented from being contaminated in the grinding and dicing processes by the second protective layer 160, so that the wire W1 connected to the conductive pad 150 may be formed.

Figure 9B:
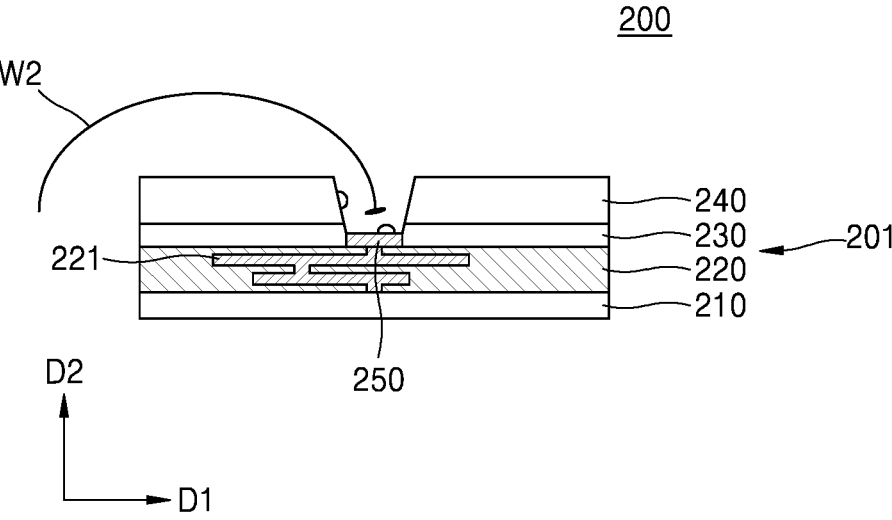

Referring to FIG. 9B, in a comparative example, the conductive pad 250 is contaminated so that the conductive connector, e.g., the wire W2, may not be formed well. For example, the wire W2 may fail to contact the conductive pad 250.

According to the method S100 of fabricating the semiconductor package 100 described with reference to FIGS. 1A, 2A, 3A, 4A, 5A, 6A, 7A, 8A, and 9A, the second protective layer 160 may be formed to protect the conductive pad 150 and prevent the conductive pad 150 from being contaminated. For example, the method S100 of fabricating the semiconductor package 100 with improved performance and reliability may be provided, according to some embodiments.

Referring to FIG. 1B, the method S101 of fabricating a semiconductor package may further include an operation S121 of hard-baking of the first protective layer 140, according to some embodiments.

For example, the hard-baking of the first protective layer 140 may be carried out after the conductive pad 150 is exposed by removing a portion of the first protective layer 140 to form the first hole 140H and removing a portion of the passivation layer 130 to form the first hole 130H. The hard bake process may include a heat treating at a higher temperature than the soft bake process and at a temperature of about 120° C. or higher to remove the solvent from the inside of the first protective layer 140. Through the hard bake process, the resistance of the first protective layer 140 to an etching process performed in a later process may be enhanced.

The second protective layer 160 may not go through a hard bake process. For example, the second protective layer 160 may be removed after serving as a protection layer to protect the conductive pad 150 in the grinding and dicing processes which are subsequent processes.

Since the second protective layer 160 is easily removed without going through the hard bake process, the overall thickness of the semiconductor package 100 fabricated according to some embodiments may be reduced. For example, the method S101 of fabricating the semiconductor package 100 having a reduced vertical thickness may be provided, according to some embodiments.

Figure 10A:
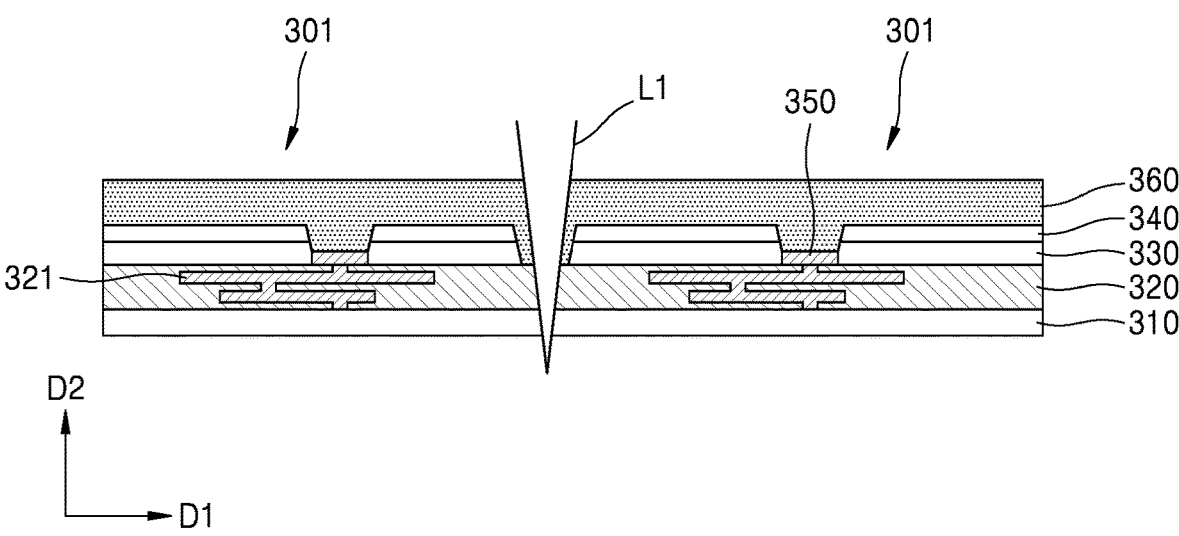
FIGS. 10A, 10B, 11 and 12 are cross-sectional views sequentially illustrating a method of fabricating a semiconductor package according to examples and comparative examples to describe a method of fabricating a semiconductor package according to some embodiments.
Figure 10B:
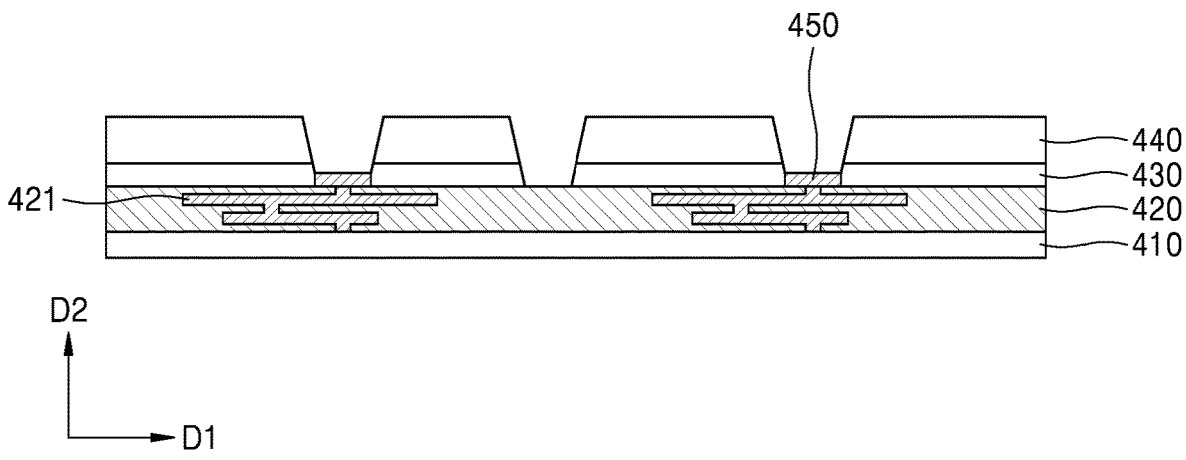
Figure 11:
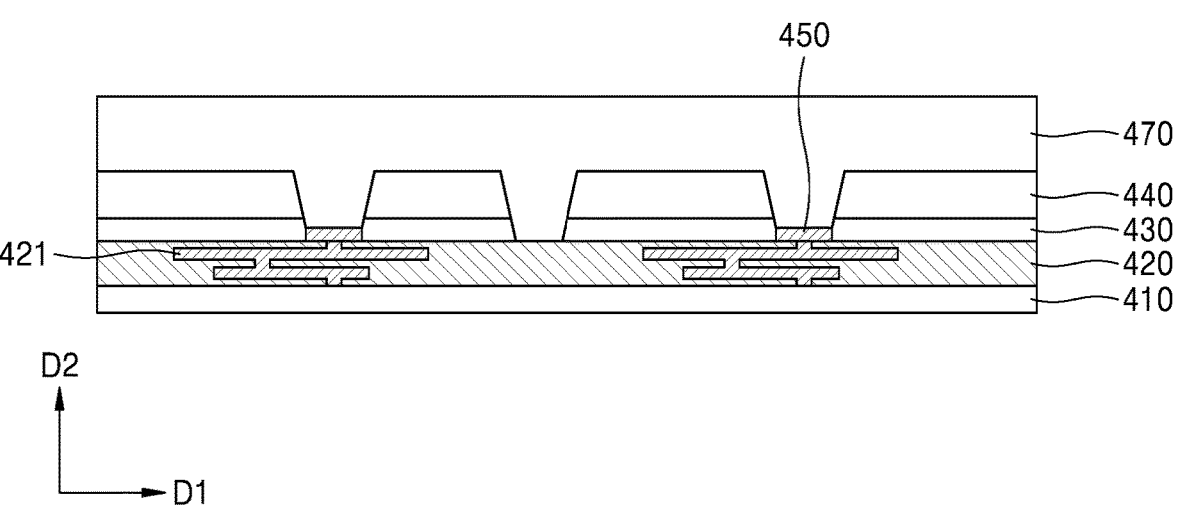
Figure 12:
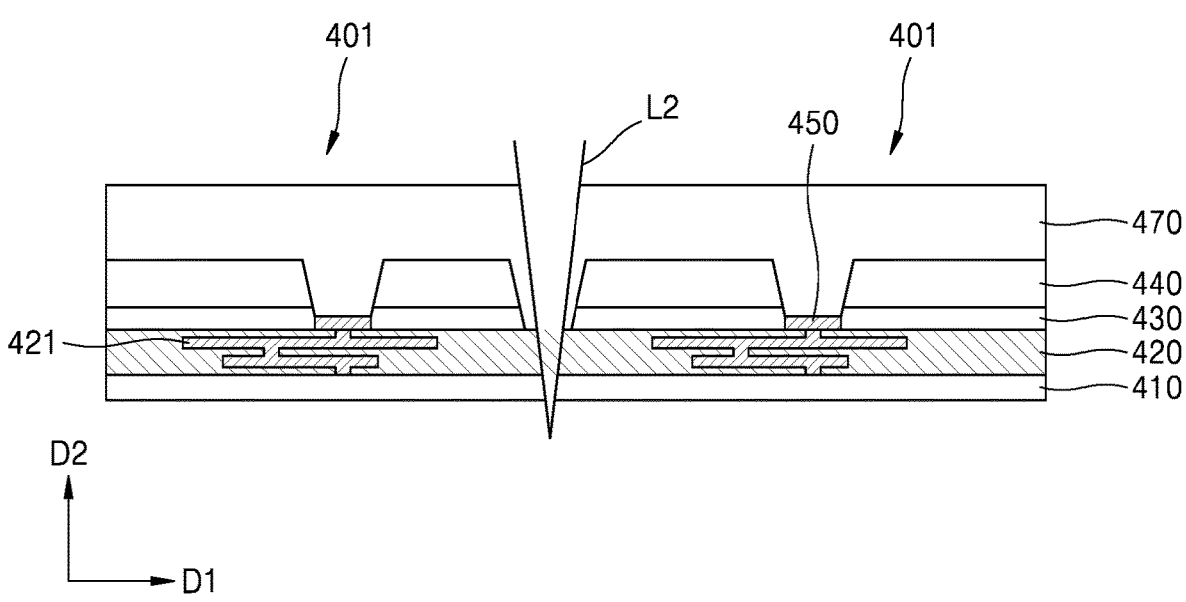

FIGS. 10A, 10B, 11 and 12 are cross-sectional views sequentially illustrating a method of fabricating a semiconductor package according to examples and comparative examples to describe a method of fabricating a semiconductor package according to some embodiments. For example, FIG. 10A is a cross-sectional view illustrating a method of fabricating a semiconductor package, which is performed subsequent to FIG. 6A, according to another example. Specifically, FIGS. 10B, 11, and 12 are cross-sectional views illustrating a method of fabricating a semiconductor package, which is performed subsequent to FIG. 6B, according to a comparative example.

Referring to FIG. 10A, an operation of dicing a semiconductor substrate 310 may be performed. While the dicing process in FIG. 7A is performed using the blade B, the dicing process described with reference to FIG. 10A may be performed using a laser L1. For example, the laser L1 may form the semiconductor chips 301 by dicing the second protective layer 360, the semiconductor element layer 320, and the semiconductor substrate 310. The second protective layer 360 may include or be formed of the same material as the second protective layer 160 described with reference to FIG. 5A. For example, the second protective layer 360 may include or be formed of a photosensitive material. For example, the second protective layer 360 may include or be formed of PSPI. In some embodiments, the second protective layer 360 may be formed through a spin coating process. In some embodiments, forming the second protective layer 360 may include applying a material of the second protective layer 360 on the first protective layer 340 and then performing a soft bake process thereon to partially remove a solvent from the inside of the second protective layer 360.

In some embodiments, the second protective layer 360 may protect the conductive pad 350 in the dicing process. For example, contamination of the conductive pad 350 due to impurities or dust that may occur in the dicing process may be prevented. Subsequently, an operation of connecting a conductive connector to the conductive pad 350 may be performed, e.g., as shown in FIG. 9A.

Referring to FIGS. 10B, 11, and 12, in a comparative example, a coating layer 470 is formed on the conductive pad 450 after grinding the semiconductor substrate 410, and a dicing process on the semiconductor substrate 410 may be performed after forming the coating layer 470 thereon. For example, the coating layer 470 may include or be formed of a water-soluble film. In some embodiments, the coating layer 470 may not go through the soft bake process.

In the present example, the coating layer 470 may prevent the conductive pad 450 from being contaminated in the dicing process. However, since the coating layer 470 may not protect the conductive pad 450 in the previous grinding process, and thus may not prevent the conductive pad 450 from being contaminated.

As illustrated with reference to FIG. 10A, the second protective layer 360 may prevent the conductive pad 350 from being contaminated in the dicing process using the laser L1. According to a method of fabricating a semiconductor package according to the inventive concept, it is possible to reduce time and cost with a reduced process, compared to the comparative example (FIGS. 10B, 11 and 12), as the second protective layer 360 is capable of protecting the conductive pad 350 in both the grinding process and the dicing process. For example, the method of fabricating the semiconductor package with the reduced process may be provided, according to some embodiments.

Figure 14A:
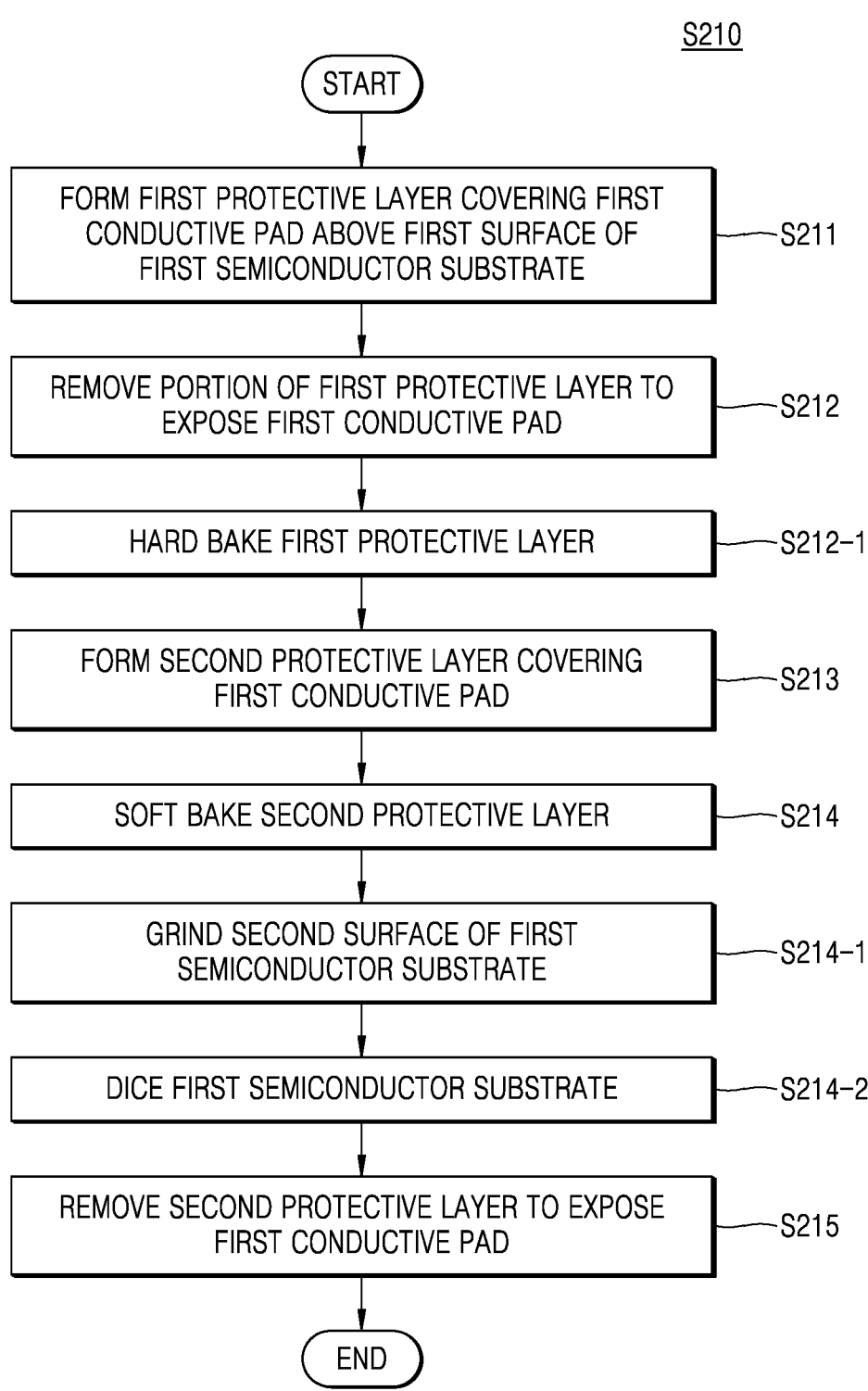

FIG. 13 is a flowchart of a method S200 of fabricating a semiconductor package structure 1000 (see FIG. 15) step by step according to some embodiments. FIGS. 14A and 14B are flowcharts of methods of fabricating semiconductor packages step by step according to some embodiments. For example, FIG. 14A is a flowchart of a method S210 of fabricating a first semiconductor package 1200 (see FIG. 15) of FIG. 13 step by step. FIG. 14B is a flowchart of a method S220 of fabricating a second semiconductor package 1300 (see FIG. 15) of FIG. 13 step by step.

Figure 15:
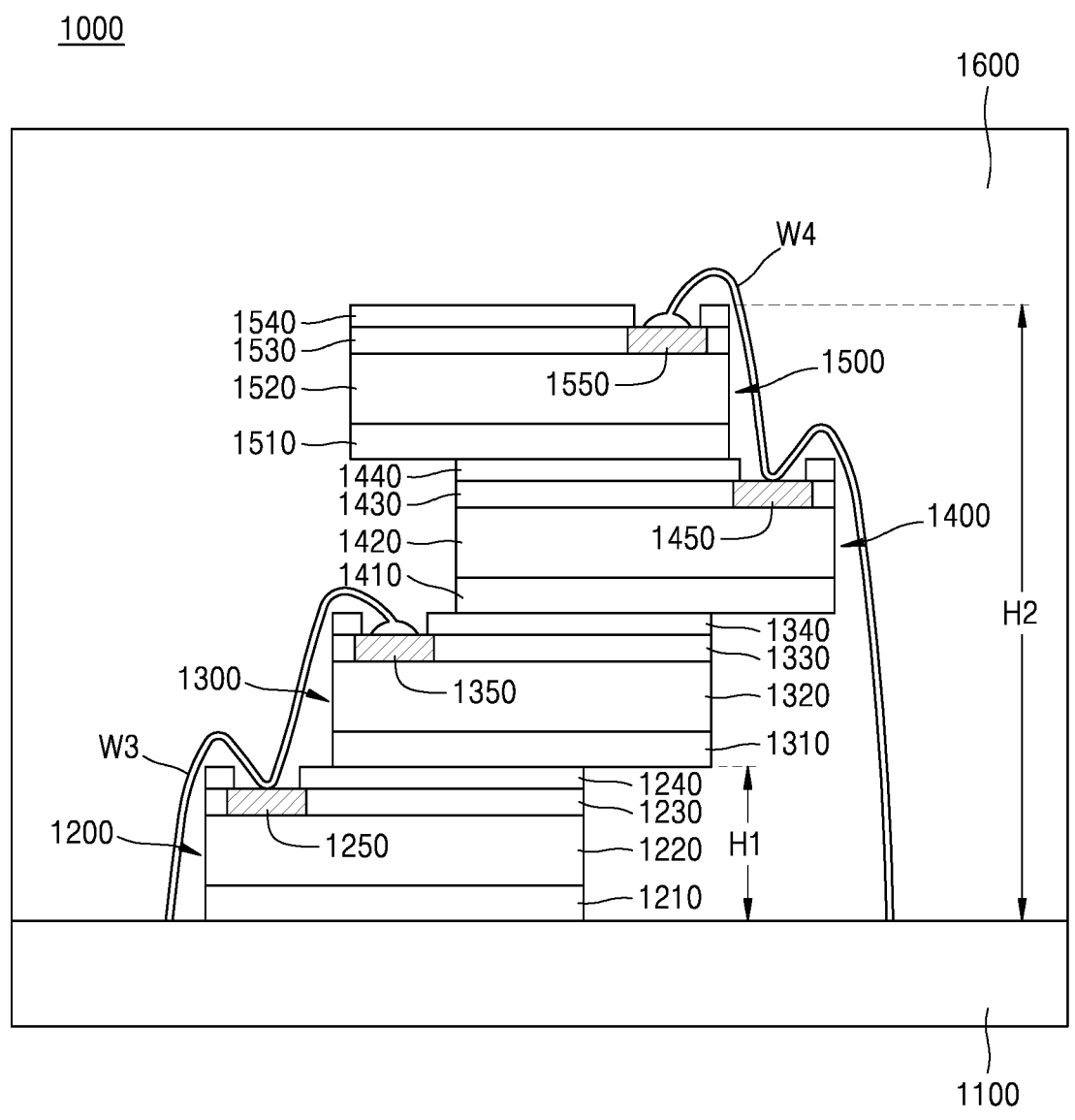
FIGS. 15 and 16 are cross-sectional views of a semiconductor package structure according to an example and a comparative example to describe a method of fabricating a semiconductor package structure according to some embodiments.
Figure 16:
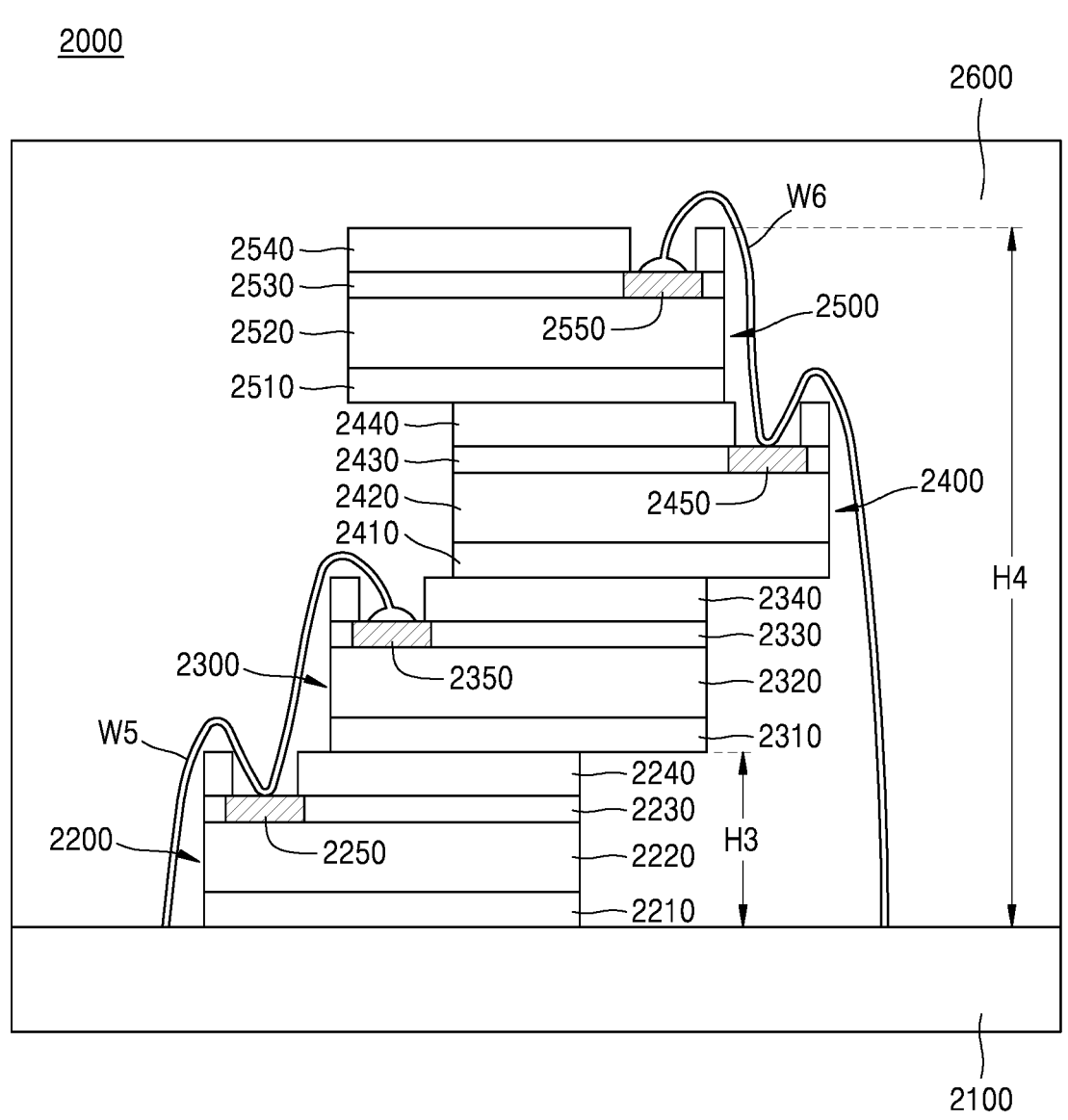

FIGS. 15 and 16 are cross-sectional views of a semiconductor package structure according to an example and a comparative example to describe a method of fabricating a semiconductor package structure according to some embodiments. For example, FIG. 15 is a cross-sectional view of a first semiconductor package 1000 including first to fourth semiconductor packages 1200, 1300, 1400, and 1500, which may be fabricated by the method of fabricating the semiconductor package structure described with reference to FIGS. 13, 14A, and 14B, according to some embodiments. For example, FIG. 16 is a cross-sectional view of a second semiconductor package structure 2000 including fifth to eighth semiconductor packages 2200, 2300, 2400, and 2500, according to the comparative example.

Referring to FIGS. 13 and 15, the method S210 of fabricating the first semiconductor package 1200 may be performed. The first semiconductor package 1200 may correspond to the semiconductor package 100 fabricated by the fabricating methods S100 and S101 illustrated with reference to FIGS. 1A, 1B, 2A, 3A, 4A, 5A, 6A, 7A, 8A, and 9A.

Referring to FIG. 14A, a method S211 of forming a first protective layer 1240 covering a first conductive pad 1250 above a first surface of a first semiconductor substrate 1210 may be performed. The first conductive pad 1250 may be formed on the first semiconductor element layer 1220 on the first surface of the first semiconductor substrate 1210. A first passivation layer 1230 may be formed on the first semiconductor element layer 1220 and the first protective layer 1240 may be formed on the first passivation layer 1230. The first semiconductor substrate 1210, the first semiconductor element layer 1220, the first passivation layer 1230, the first protective layer 1240, and the first conductive pad 1250 may be the same as the descriptions above with reference to the semiconductor substrate 110, the semiconductor element layer 120, the passivation layer 130, the first protective layer 140, and the conductive pad 150. For example, the first protective layer 1240 may include or be formed of PSPI. For example, the first protective layer 1240 may have a thickness of about 3 μm or less. The first surface of the first semiconductor substrate 1210 may refer to a surface on which the first conductive pad 1250 is formed. Similar to the forming of the first protective layer 140, forming the first protective layer 1240 may include applying a material that is to constitute the first protective layer 1240 and then performing a soft bake process thereon.

Subsequently, an operation S212 of removing a portion of the first protective layer 1240 to expose the first conductive pad 1250 may be performed. Removing a portion of the first protective layer 1240 may be the same as the removing a portion of the first protective layer 140 described with reference to FIG. 3A above. For example, removing a portion of the first protective layer 1240 may include exposing a portion of the first protective layer 1240 and removing the exposed portion or the unexposed portion of the first protective layer 1240.

Subsequently, an operation S212-1 of hard-baking of the first protective layer 1240 may be performed. The hard-baking of the first protective layer 1240 may be the same as the hard-baking of the first protective layer 140 described with reference to FIG. 1B above. Through the hard bake process, resistance of the first protective layer 1240 to an operation of removing a second protective layer to be performed later may be enhanced.

Subsequently, an operation S213 of forming the second protective layer (not shown) covering the first conductive pad 1250 may be performed. The second protective layer and the method of forming the second protective layer may be the same as the ones described with reference to the second protective layer 160 of FIG. 5A above. For example, the second protective layer may include or be formed of an insulating material. For example, the second protective layer may include or be formed of a photosensitive material, but is not limited thereto. The second protective layer may be formed through a spin coating process.

Subsequently, an operation S214 of soft-baking the second protective layer may be performed. However, unlike the first protective layer 1240, hard-baking of the second protective layer may not be performed.

Subsequently, an operation S214-1 of grinding a second surface of the first semiconductor substrate 1210 and an operation S214-2 of dicing the first semiconductor substrate 1210 may be performed. In the grinding operation and the dicing operation, the second protective layer may protect the first conductive pad 1250 and prevent the first conductive pad 1250 from being contaminated.

Subsequently, an operation S215 of removing the second protective layer to expose the first conductive pad 1250 may be performed. For example, the second protective layer may include or be formed of an easily removable material, and when the second protective layer includes or be formed of a photosensitive material that undergoes a soft bake process, a hard bake process may not be performed thereon. While the second protective layer is removed, the first protective layer 1240 may not be removed.

Subsequently, referring to FIGS. 13 and 15, a method S220 of fabricating the second semiconductor package 1300 may be performed.

For example, referring to FIG. 14B, the second semiconductor package 1300 including a second semiconductor substrate 1310, a second semiconductor device layer 1320, a second passivation layer 1330, a third protective layer 1340, and a second conductive pad 1350 may be fabricated. The operation S220 of fabricating the second semiconductor package 1300 may be the same as or similar to the operation S210 of fabricating the first semiconductor package 1200 described with reference to FIG. 14A. For example, the second semiconductor package 1300 may be fabricated (S220) by performing an operation S221 of forming a third protective layer 1340 covering a second conductive pad 1350 above a first surface of a second semiconductor substrate 1310, an operation S222 of removing a portion of the third protective layer 1340 to expose the second conductive pad 1350, an operation S222-1 of hard-baking of the third protective layer 1340, an operation S223 of forming a fourth protective layer (not shown) covering the second conductive pad 1350, an operation S224 of soft-baking the fourth protective layer, an operation S224-1 of grinding a second surface of the second semiconductor substrate 1310, an operation S224-2 of dicing the second semiconductor substrate 1310, and an operation of removing the fourth protective layer to expose the second conductive pad 1350.

Subsequently, referring to FIGS. 13 and 15, an operation S230 of mounting the first semiconductor package 1200 and the second semiconductor package 1300 on the package substrate 1100 may be performed. The second semiconductor package 1300 may be mounted on the first semiconductor package 1200. A third wire W3 electrically connecting the package substrate 1100, the first semiconductor package 1200, and the second semiconductor package 1300 may be formed. The third wire W3 may electrically connect the first conductive pad 1250 of the first semiconductor package 1200 and the second conductive pad 1350 of the second semiconductor package 1300.

Similarly, a third semiconductor package 1400 including a third semiconductor substrate 1410, a third semiconductor element layer 1420, a third passivation layer 1430, a fifth protective layer 1440, and a third conductive pad 1450 may be fabricated. Similar to the method of fabricating the first semiconductor package 1200 and the second semiconductor package 1300, a sixth protective layer (not shown) that protects the third conductive pad 1450 and prevents the third conductive pad 1450 from being contaminated in the process of fabricating the third semiconductor package 1400 may be formed and then removed after a grinding process and a dicing process.

Similarly, a fourth semiconductor package 1500 including a fourth semiconductor substrate 1510, a fourth semiconductor element layer 1520, a fourth passivation layer 1530, a seventh protective layer 1540, and a fourth conductive pad 1550 may be fabricated. In the process of fabricating the fourth semiconductor package 1500, an eighth protective layer (not shown) that protects the fourth conductive pad 1550 and prevents the fourth conductive pad 1550 from being contaminated may be formed and then removed after a grinding process and a dicing process.

Subsequently, the third semiconductor package 1400 and the fourth semiconductor package 1500 may be mounted on the package substrate 1100. A fourth wire W4 electrically connecting the package substrate 1100, the third conductive pad 1450 of the third semiconductor package 1400, and the fourth conductive pad 1550 of the fourth semiconductor package 1500 may be formed.

As shown in FIG. 15, the first semiconductor package structure 1000 may include a first package substrate 1100, and first to fourth semiconductor packages 1200, 1300, 1400, and 1500 mounted on the first package substrate 1100. The first semiconductor package structure 1000 may further include a first molding layer 1600 for molding the first to fourth semiconductor packages 1200, 1300, 1400, and 1500. The first molding layer 1600 may include or be formed of, for example, epoxy molding compound (EMC).

Referring to FIG. 16, compared to FIG. 15, a second semiconductor package structure 2000 may include a second package substrate 2100, and fifth to eighth semiconductor packages 2200, 2300, 2400, and 2500 mounted on the second package substrate 2100. The fifth to eighth semiconductor packages 2200, 2300, 2400, and 2500 may be fabricated by the method of fabricating the semiconductor package 200 according to the comparative example described with reference to FIGS. 2B, 3B, 4B, 5B, 6B, 7B, 8B, and 9B. The second semiconductor package structure 2000 may further include a second molding layer 2600 for molding the fifth to eighth semiconductor packages 2200, 2300, 2400, and 2500. The second molding layer 2600 may include or be formed of, for example, EMC.

As described in FIGS. 15 and 16, a vertical thickness H1 of the first semiconductor package 1200 of the first semiconductor package structure 1000 may be less than a vertical thickness H3 of the fifth semiconductor package 2200 of the second semiconductor package structure 2000. Similarly, a vertical thickness of each of the second to fourth semiconductor packages 1300, 1400, and 1500 of the first semiconductor package structure 1000 may be less than that of each of the sixth to eighth semiconductor packages 2300, 2400, and 2500 of the second semiconductor package structure 2000. Accordingly, a total thickness H2 of the first to fourth semiconductor packages of the first semiconductor package structure 1000 may be less than a total thickness H4 of the fifth to eighth semiconductor packages of the second semiconductor package structure 2000. For example, a total thickness of the first semiconductor package structure 1000 may be less than a total thickness of the second semiconductor package structure 2000. For example, the method S200 of fabricating the first semiconductor package structure 1000 having a reduced vertical thickness may be provided, according to some embodiments.

The method S200 of fabricating a semiconductor package structure 1000 including semiconductor packages with a reduced process and the method S200 of fabricating a semiconductor package structure 1000 including semiconductor packages with the improved performance and reliability may be provided, as each of the first to fourth semiconductor packages 1200, 1300, 1400, and 1500 of the first semiconductor package structure 1000 may be the same as or correspond to the semiconductor package 100 fabricated by the fabricating methods S100 and S101 described with reference to FIGS. 1A, 1B, 2A, 3A, 4A, 5A, 6A, 7A, 8A, and 9A above.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

While the inventive concept has been particularly shown and described with reference to embodiments thereof, it will be understood that various changes in form and details may be made therein without departing from the spirit and scope of the following claims.

What is claimed is:

1. A method of fabricating a semiconductor package, the method comprising:

forming a passivation layer and a first protective layer covering a semiconductor substrate and a conductive pad above a first surface of the semiconductor substrate;

removing a portion of the passivation layer and a portion of the first protective layer to expose the conductive pad;

forming a second protective layer covering the conductive pad on the first protective layer;

grinding a second surface opposite the first surface of the semiconductor substrate;

dicing the semiconductor substrate; and removing the second protective layer to expose the conductive pad, wherein the second protective layer does not expose the conductive pad in the grinding process and the dicing process.

2. The method of claim 1, wherein the method further comprises performing a hard-baking of the first protective layer after exposing the conductive pad, and wherein the method does not perform a hard-baking of the second protective layer.

3. The method of claim 1, wherein the dicing of the semiconductor substrate is performed using at least one of a blade and a laser.

4. The method of claim 1, wherein the first protective layer includes a photosensitive material.

5. The method of claim 1, wherein a thickness of the first protective layer is 3 μm or less.

6. The method of claim 1, wherein a thickness of the second protective layer is greater than a thickness of the first protective layer.

7. The method of claim 1, wherein at least a portion of the first protective layer is not removed while the second protective layer is removed.

8. A method of fabricating a semiconductor package structure, the method comprising:

forming a first semiconductor package including forming a first protective layer exposing a first conductive pad above a first surface of a first semiconductor substrate, forming a second protective layer covering the first conductive pad on the first protective layer, performing a soft-baking of the second protective layer, and removing the second protective layer to expose the first conductive pad;

forming a second semiconductor package including forming a third protective layer exposing a second conductive pad above a first surface of a second semiconductor substrate, forming a fourth protective layer covering the second conductive pad on the third protective layer, and removing the fourth protective layer to expose the second conductive pad; and mounting the first semiconductor package on a package substrate and the second semiconductor package on the first semiconductor package.

9. The method of claim 8, wherein the method further comprises performing a hard-baking of the first protective layer, and wherein the method does not perform a hard-baking of the second protective layer.

10. The method of claim 8, further comprising:

grinding a second surface opposite the first surface of the first semiconductor substrate; and dicing the first semiconductor substrate;

wherein the second protective layer does not expose the first conductive pad during the dicing and during the grinding.

11. The method of claim 10, wherein the dicing of the first semiconductor substrate is performed using at least one of a blade and a laser.

12. The method of claim 8, further comprising electrically connecting the first conductive pad and the second conductive pad to the package substrate.

13. The method of claim 8, wherein the first protective layer includes a photosensitive material.

14. The method of claim 13, wherein the second protective layer includes a photosensitive material.

15. The method of claim 8, wherein a thickness of the second protective layer is greater than a thickness of the first protective layer.

16. A method of fabricating a semiconductor package, the method comprising:

forming a passivation layer and a first protective layer covering a semiconductor substrate and a conductive pad above a first surface of the semiconductor substrate, the first protective layer including a photosensitive material;

removing a portion of the passivation layer and a portion of the first protective layer to expose the conductive pad;

performing a hard-baking of the first protective layer;

forming a second protective layer covering the conductive pad on the first protective layer;

grinding a second surface opposite the first surface of the semiconductor substrate;

dicing the semiconductor substrate;

removing the second protective layer to expose the conductive pad; and connecting the exposed conductive pad to a conductive connector;

wherein the second protective layer does not expose the conductive pad in the grinding operation and the dicing operation.

17. The method of claim 16, wherein at least a portion of the first protective layer is not removed while the second protective layer is removed.

18. The method of claim 16, wherein the second protective layer includes a photosensitive material.

19. The method of claim 16, wherein the method does not perform a hard-baking of the second protective layer.

20. The method of claim 16, wherein the forming of the second protective layer includes a spin-coating process.

* * * * *